US010679560B2

(12) United States Patent
Huang et al.

(10) Patent No.: US 10,679,560 B2
(45) Date of Patent: Jun. 9, 2020

(54) DISPLAY DEVICES

(71) Applicant: InnoLux Corporation, Miao-Li County (TW)

(72) Inventors: Sheng-Feng Huang, Miao-Li County (TW); Cheng-Shen Pan, Miao-Li County (TW); Cheng-Min Wu, Miao-Li County (TW); Li-Wei Sung, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 30 days.

(21) Appl. No.: 16/051,629

(22) Filed: Aug. 1, 2018

(65) Prior Publication Data

US 2019/0073956 A1 Mar. 7, 2019

Related U.S. Application Data

(60) Provisional application No. 62/553,181, filed on Sep. 1, 2017.

(30) Foreign Application Priority Data

Jan. 9, 2018 (CN) .......................... 2018 1 0018519

(51) Int. Cl.

| | |
|---|---|
| ***G09G 3/3258*** | (2016.01) |
| ***G09G 3/36*** | (2006.01) |
| ***G09G 3/00*** | (2006.01) |
| ***H01L 51/52*** | (2006.01) |
| *G09G 3/3266* | (2016.01) |

(52) U.S. Cl.

CPC ........... *G09G 3/3258* (2013.01); *G09G 3/007* (2013.01); *G09G 3/3677* (2013.01); *H01L 51/5203* (2013.01); *G09G 3/3266* (2013.01); *G09G 2300/0838* (2013.01); *G09G 2310/0267* (2013.01); *G09G 2310/0289* (2013.01)

(58) Field of Classification Search

None

See application file for complete search history.

(56) References Cited

U.S. PATENT DOCUMENTS 6,157,361 A * 12/2000 Kubota ................ G09G 3/3674 257/E27.111
6,191,779 B1 * 2/2001 Taguchi ............... G09G 3/2011 345/204
6,256,024 B1 * 7/2001 Maekawa ............ G09G 3/3688 345/205
2001/0017608 A1 * 8/2001 Kogure ................ G09G 3/3677 345/87

(Continued)

*Primary Examiner* — Nicholas J Lee

(74) *Attorney, Agent, or Firm* — McClure, Qualey & Rodack, LLP

(57) ABSTRACT

A display device includes a pixel array, multiple data lines, and multiple gate lines. The pixel array includes multiple pixel units. The data lines are coupled to the pixel array. The gate lines are coupled to the pixel array. One of the pixel units includes a switch circuit, a display unit, and a first voltage level shifting circuit. The switch circuit is coupled to one of the data lines and one of the gate lines. The first voltage level shifting circuit is coupled between the switch circuit and the display unit and configured to adjust the voltage level of a data driving signal provided by the data line to the display unit.

18 Claims, 19 Drawing Sheets

(56) References Cited

U.S. PATENT DOCUMENTS

| | | | | |
|---|---|---|---|---|
| 2002/0018060 | A1* | 2/2002 | Yamazaki | G09G 3/3275 345/211 |
| 2007/0171187 | A1 | 7/2007 | Saito | |
| 2013/0063499 | A1 | 3/2013 | Tanaka et al. | |
| 2013/0194247 | A1 | 8/2013 | Onoue | |
| 2016/0012790 | A1* | 1/2016 | Zheng | G09G 3/3688 345/204 |
| 2017/0154568 | A1* | 6/2017 | Tsuchi | G09G 3/2092 |

* cited by examiner

DISPLAY DEVICES

CROSS REFERENCE TO RELATED APPLICATIONS

This application claims the benefit of U.S. Provisional Application No. 62/553,181 filed Sep. 1, 2017 and entitled "Level Shift for EPD", the entire contents of which are hereby incorporated by reference.

This application also claims priority of China Patent Application No. 201810018519.0, filed on Jan. 9, 2018, the entirety of which is incorporated by reference herein.

BACKGROUND

Field of the Disclosure

The disclosure relates to a display device, and more particularly to a display device with a display panel.

Description of the Related Art

There are many different types of displays being developed in today's display technologies, including the Organic Light-Emitting Diode (OLED) displays, Liquid-Crystal Displays (LCDs), Micro Light-Emitting Diode Displays (Micro-LEDs), Quantum Dot Displays, Electronic Paper Displays (EPDs), and the like. The driving voltage level required by each display is different. The higher the absolute value of the driving voltage level required by the display, the greater the power consumption.

In order to reduce the power consumption of a display device that requires a high driving voltage, various display panel designs are proposed.

BRIEF SUMMARY OF THE DISCLOSURE

Display devices are provided. An exemplary embodiment of a display device comprises a pixel array, a plurality of data lines and a plurality of gate lines. The pixel array comprises a plurality of pixel units. The data lines are coupled to the pixel array. The gate lines are coupled to the pixel array. One of the pixel units comprises a plurality of a switch circuits, a display unit, and a first voltage level shifting circuit. The switch circuit is coupled to one of the data lines and one of the gate lines. The first voltage level shifting circuit is coupled between the switch circuit and the display unit and is configured to adjust the voltage level of a data driving signal provided by the data line to the display unit.

Another exemplary embodiment of a display device comprises a pixel array, a plurality of data lines and a plurality of gate lines. The pixel array comprises a plurality of pixel units. The data lines are coupled to the pixel array. The gate lines are coupled to the pixel array. One of the pixel units comprises a plurality of a switch circuits, a display unit, and a first voltage level shifting circuit. The switch circuit is coupled to one of the data lines and one of the gate lines. The first voltage level shifting circuit is coupled between the switch circuit and the display unit and is configured to adjust the voltage level of a data driving signal provided by the data line to the display unit. An absolute value of a level of a driving voltage required by the display unit is higher than a predetermined voltage level.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION OF THE DISCLOSURE

The following description is of the contemplated mode of carrying out the disclosure. This description is made for the purpose of illustrating the general principles of the disclosure and should not be taken in a limiting sense. The scope of the disclosure is determined by reference to the appended claims.

In order to make the features of the disclosure more clear and easy to understand, the specific embodiments of the disclosure are given below and the accompanying drawings are described in detail as follows. The purpose of which is to explain the spirit of the present disclosure rather than to limit the protection scope of the present disclosure. It should be understood that the following embodiments may be implemented by software, hardware, firmware, or any combination of the above.

In the present disclosure, the technical features of the various embodiments may be substituted or combined with each other to achieve other embodiments when they are not mutually exclusive.

In the present disclosure, the term "coupling", if not specifically defined, includes direct connection, indirect connection, electrical connection, and electrical coupling.

Figure 1:
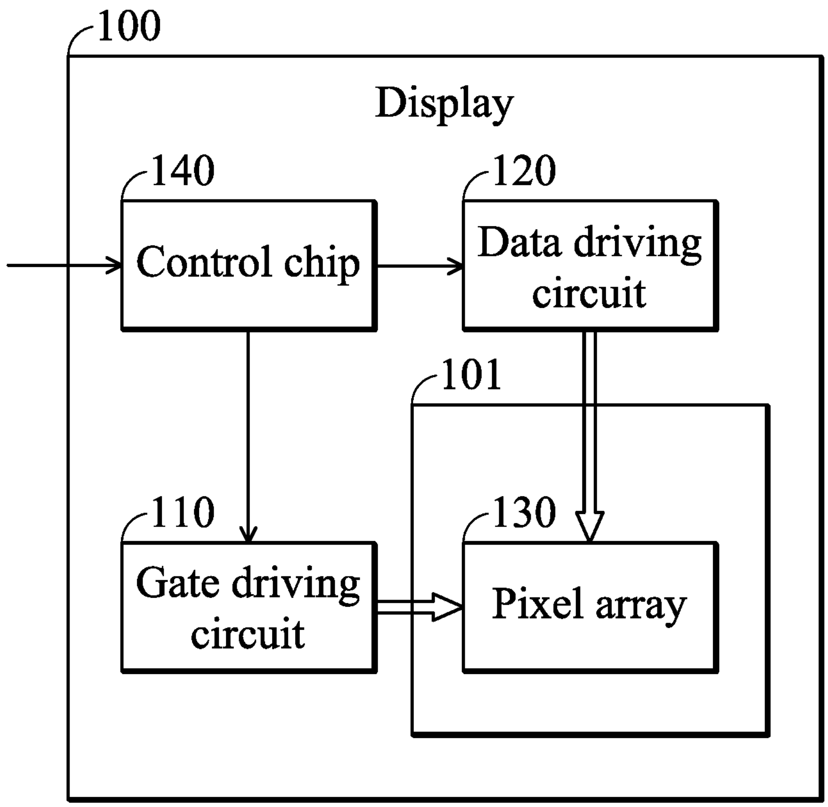
FIG. 1 is a block diagram of a display device according to an embodiment of the disclosure.

FIG. 1 is a block diagram of a display device according to an embodiment of the disclosure. As shown in FIG. 1, the display device 100 may comprise a display panel 101, a gate driving circuit 110, a data driving circuit 120 and a control chip 140. The display panel 101 may comprise a pixel array 130. The gate driving circuit 110 is coupled to the pixel array 130 via a plurality of gate lines, and is configured to provide a plurality of gate driving signals on the gate lines to drive a plurality of pixel units in the pixel array 130. The data driving circuit 120 is coupled to the pixel array 130 via a plurality of data lines, and is configured to provide a plurality of data driving signals on the data lines so as to write the image data to the pixel units in the pixel array 130 via the data driving signals. The control chip 140 is configured to receive an external signal and generate a plurality of timing signals, comprising clock signals, reset signals, start pulses, ending signals, or others. It should be noted that the display panel 101 may be an LCD panel, an OLED panel, a Micro-LED panel, a Quantum Dot Display or an EPD panel. And in the disclosure, the display panel 101 may be a flexible, stretchable or rigid display panel.

According to an embodiment of the disclosure, the display device 100 may be comprised in an electronic device. The electronic device may be implemented as various devices, comprising: a mobile phone, a digital camera, a mobile computer, a personal computer, a television, an in-vehicle display, a portable DVD player, or any apparatus with image display functionality.

According to an embodiment of the disclosure, as shown in FIG. 1, the gate driving circuit 110 is disposed outside of the pixel array 130, but the disclosure should not be limited thereto. In other embodiments of the disclosure, the gate driving circuit 110 may also be disposed inside of the pixel array 130. Similarly, although in FIG. 1, the gate driving circuit 110 is not disposed on the display panel 101, the disclosure should not be limited thereto. In other embodiments of the disclosure, the gate driving circuit 110 may also be disposed on the display panel 101. It should be noted that in this disclosure, a region occupied by the pixel array 130 is an active area (AA) of the display panel 101 to display the image, and the region not being occupied by the pixel array 130 is the non-active area (NA) of the display panel 101 for placing the peripheral circuits. In addition, the gate driving circuit 110 disposed on the display panel 101 may refer to the gate driving circuit 110 that is fabricated on the substrate of the display panel 101 by a photolithographic process, so that the flexible circuit board and the driving chip can be omitted and the production cost can be reduced.

Figure 2:
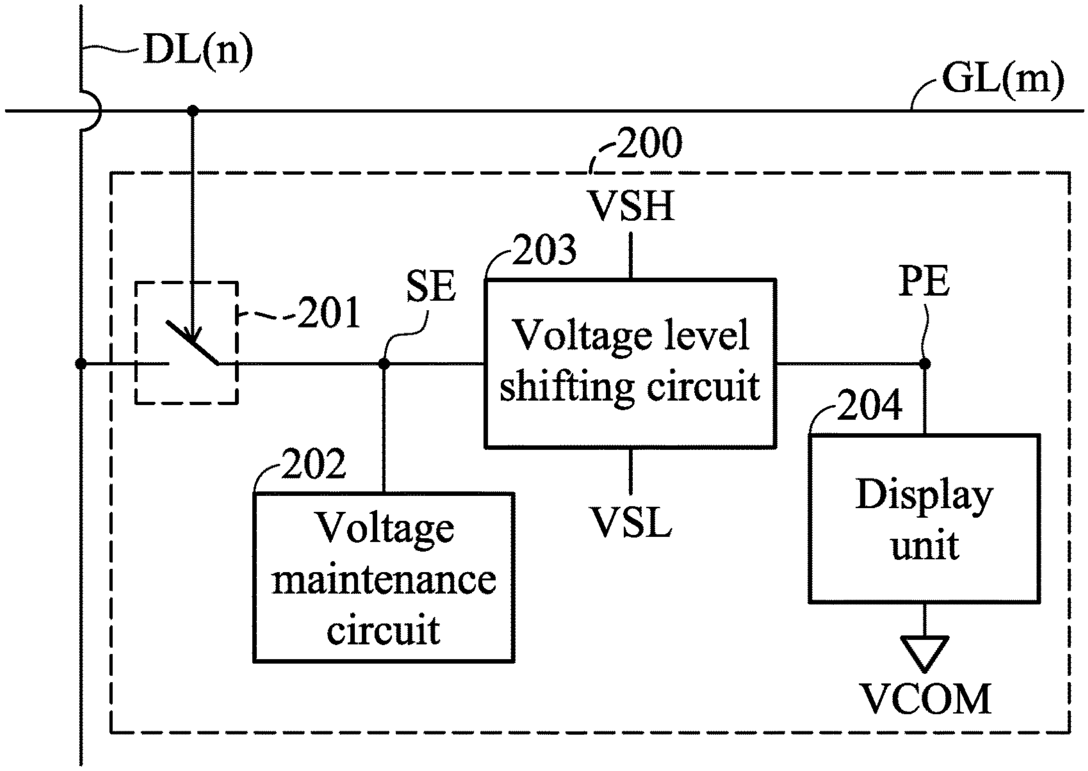
FIG. 2 is a block diagram of a pixel unit according to an embodiment of the disclosure.

FIG. 2 is a block diagram of a pixel unit according to an embodiment of the disclosure. The pixel unit 200 may comprise a switch circuit 201, a voltage maintenance circuit 202, a voltage level shifting circuit (the first voltage level shifting circuit) 203 and a display unit 204. The switch circuit 201 is coupled to the data line DL(n) and the gate line GL(m), where m and n are positive integers. The switch circuit 201, the voltage maintenance circuit 202 and the voltage level shifting circuit 203 are commonly coupled to the storage electrode terminal SE. The voltage level shifting circuit 203 and the display unit 204 are coupled to the pixel electrode PE. The voltage level shifting circuit 203 is coupled between the switch circuit 201 and the display unit 204 and is configured to receive the target voltage VSH and/or VSL (which can be flexibly designed based on the circuit requirements, and will be illustrated in more detailed in the following paragraphs), and adjust the voltage level of the data driving signal provided by the data line DL(n) to the display unit 204 according to the target voltage VSH and/or VSL. The level of the target voltage VSH may be set to a target high level required by the display unit 204, and the level of the target voltage VSL may be set to a target low level required by the display unit 204. In this disclosure, the display unit 204 may be the LCD unit, the OLED unit, the LED unit, the Quantum Dot Display unit or the EPD unit. The size of the LED unit may be distinguished by the LED having the size of 300 μm to 10 mm, the mini-LED having the size of 100 μm to 300 μm and the micro-LED having the size of 1 μm to 100 μm.

The proposed display panel designs in the disclosure are suitable for the display panels that require high driving voltage. According to an embodiment of the disclosure, the absolute value of the voltage level of the driving voltage required by the display unit 204 may be higher than a predetermined voltage level, for example, 10V(volts). For example, according to an embodiment of the disclosure, the voltage level of the driving voltage (e.g. the data driving signal) is usually at +15V or −15V. Therefore, in this embodiment, the level of the target voltage VSH may be set to +15V and the level of the target voltage VSL may be set to −15V. For example, an absolute value of the one of the target voltage VSH and the target voltage VSL is greater than 10V and less than 20V. However, the levels of the target voltages VSH and VSL should not be limited to this range.

Since the pixel unit requires relative high driving voltage, here, the relative high driving voltage is relative to the voltage level generated by the data driving circuit 120, in the embodiment of the disclosure, the pixel unit 200 may comprise at least one voltage level shifting circuit for adjusting the voltage level of the data driving signal provided to the display unit 204. In this manner, the data driving circuit 120 may not have to generate the data driving signals having high voltage level (for example, the absolute value higher than 10V). In other words, the voltage level of the data driving signal generated by the data driving circuit 120 may be lower than the driving voltage level required by the display unit 204, and the power consumption or the production cost of the data driving circuit 120 can be effectively reduced.

According to a first aspect embodiment of the disclosure, the voltage level shifting circuit may be configured inside of the pixel array. To be more specific, multiple voltage level shifting circuits may be respectively disposed in the pixel units 200 of the pixel array. In the following embodiments, for simplicity, only one of the pixel units 200 is shown as an example.

Figure 3:
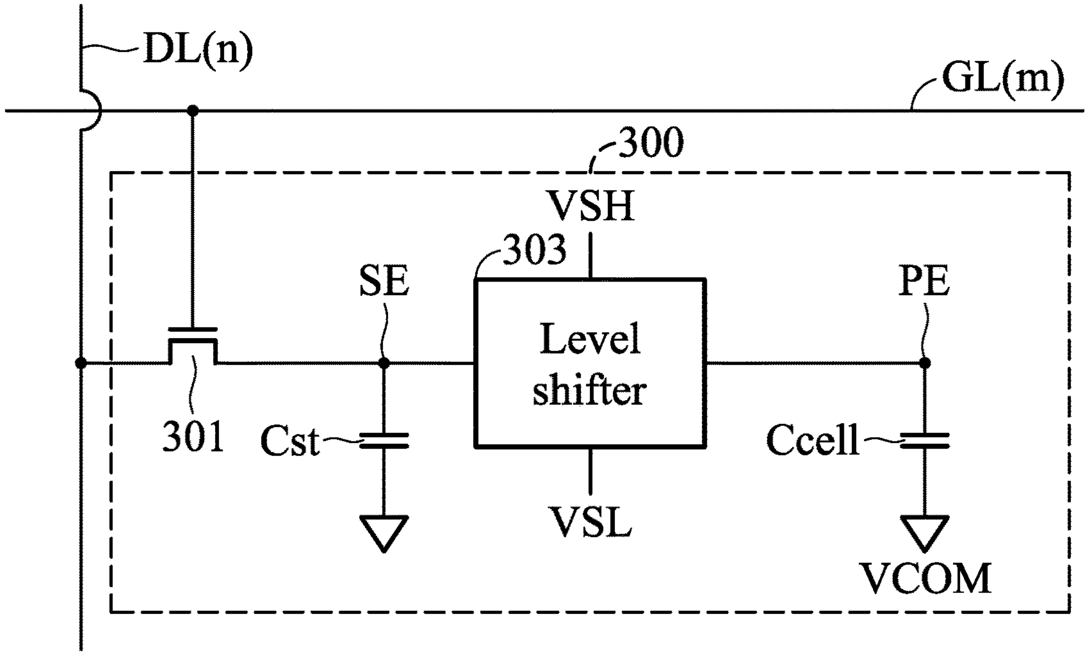
FIG. 3 is an exemplary circuit diagram of a pixel unit according to a first aspect embodiment of the disclosure.

FIG. 3 is an exemplary circuit diagram of a pixel unit according to a first aspect embodiment of the disclosure. The pixel unit 300 may comprise a transistor 301 as a switch circuit, a storage capacitor Cst, a level shifter 303 and a display unit, where the capacitor Ccell represents the display unit.

According to an embodiment of the disclosure, the voltage level of the data driving signal D(n) provided by the data line DL(n) may be selected from a group comprising voltage levels Vsl and Vsh. That is, the voltage swing of data driving signal D(n) is in the range Vsl~Vsh, where the voltage level Vsh is higher than the voltage level Vsl, and the absolute values of Vsl and Vsh are respectively less than the absolute value of VSL and VSH. In other words, the voltage levels of the data driving signal D(n) may comprise the voltage levels of Vsh and Vsl. At some time, the voltage level of the data driving signal D(n) is Vsl. At the other time, the voltage level of the data driving signal D(n) is Vsh. The voltage level of the gate driving signal G(m) on the gate line GL(m) may be selected from a group comprising voltage levels VGL and VGH. That is, the voltage swing of gate driving signal G(m) is in the range VGL~VGH, where the voltage level VGH is higher than the voltage level VGL, and the absolute value of VGH and VGL are slightly higher than the absolute value of Vsh and Vsl, respectively, for controlling the on-off status of the transistor 301.

When a pulse of the gate driving signal G(m) on the gate line GL(m) arrives, the transistor 301 is turned on, such that the data driving signal D(n) on the data line DL(n) is provided to the storage electrode terminal SE. The storage electrode terminal SE is coupled to an input terminal of the shift register 303. The pixel electrode terminal PE is coupled to an output terminal of the shift register 303. The shift register 303 is configured to adjust the voltage level of the signal (such as the data driving signal) received at the input terminal according to the target voltage VSH and/or VSL, and generate a voltage-shifted signal at the output terminal. The shift register 303 may be configured to amplify the received signal, such that the voltage level of the voltage-shifted signal may be pulled up from the original voltage level Vsh to the level of the target voltage VSH and/or pulled down from the original voltage level Vsl to the level of the target voltage VSL.

Figure 4A:
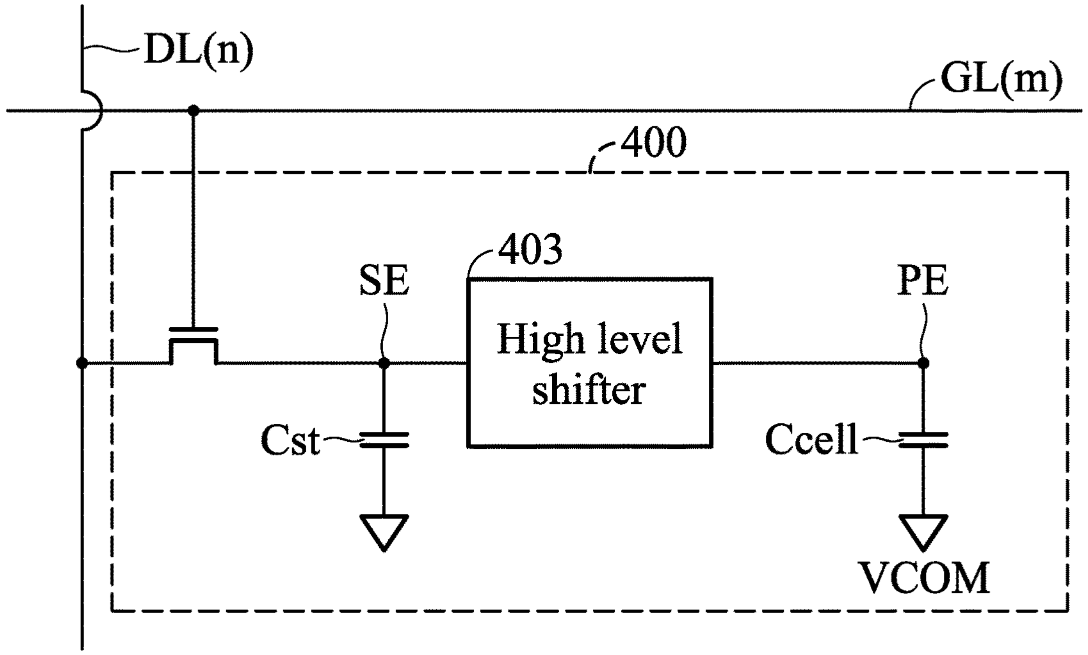
FIG. 4A is a circuit diagram of a pixel unit according to a first embodiment of the disclosure.
Figure 4B:
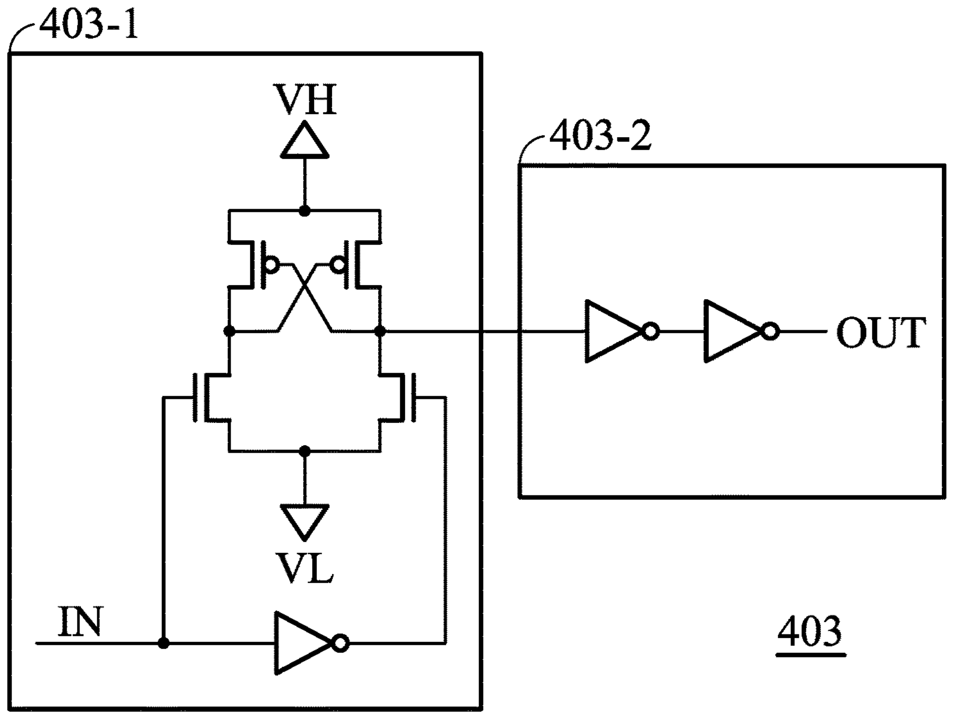
FIG. 4B is an exemplary circuit diagram of a high level shifter according to an embodiment of the disclosure.
Figure 4C:
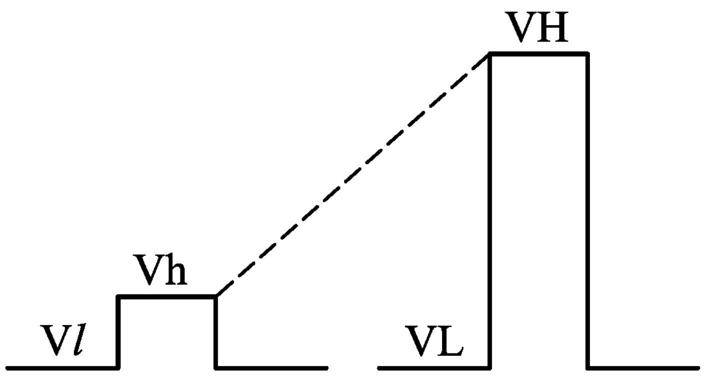
FIG. 4C is a schematic diagram showing the voltage levels of the input signal and the output signal of a high level shifter according to an embodiment of the disclosure.

FIG. 4A is a circuit diagram of a pixel unit according to a first embodiment of the disclosure. The pixel unit 400 may comprise a high level shifter 403. FIG. 4B is an exemplary circuit diagram of a high level shifter according to an embodiment of the disclosure. FIG. 4C is a schematic diagram showing the voltage levels of the input signal and the output signal of a high level shifter according to an embodiment of the disclosure. The high level shifter 403 may comprise a level shifter circuit unit 403-1 and a buffer circuit unit 403-2, where the buffer circuit unit 403-2 may be utilized to enhance the driving ability of the signal. The buffer circuit unit 403-2 may be an optional choice, that is, the high level shifter 403 may also not comprise the buffer circuit unit 403-2. In this embodiment, the voltage level of the signal received at the input terminal IN of the high level shifter 403 may be Vl or Vh, and the voltage level of the voltage-shifted signal generated at the output terminal OUT of the high level shifter 403 may be VL or VH. In this embodiment, the voltage VL may be set to the level of the target voltage VSL, for example, −15V, and the voltage VH may be set to the level of the target voltage VSH, for example, +15V. The low voltage level V1 of the input signal may already reach the level of the target voltage VSL. Therefore, in this embodiment, the high level shifter 403 may be utilized to adjust the high voltage level of the input signal, such that the high and low voltage levels of the voltage-shifted signal may be the same as the levels of the target voltages VSH and VSL.

Figure 4D:
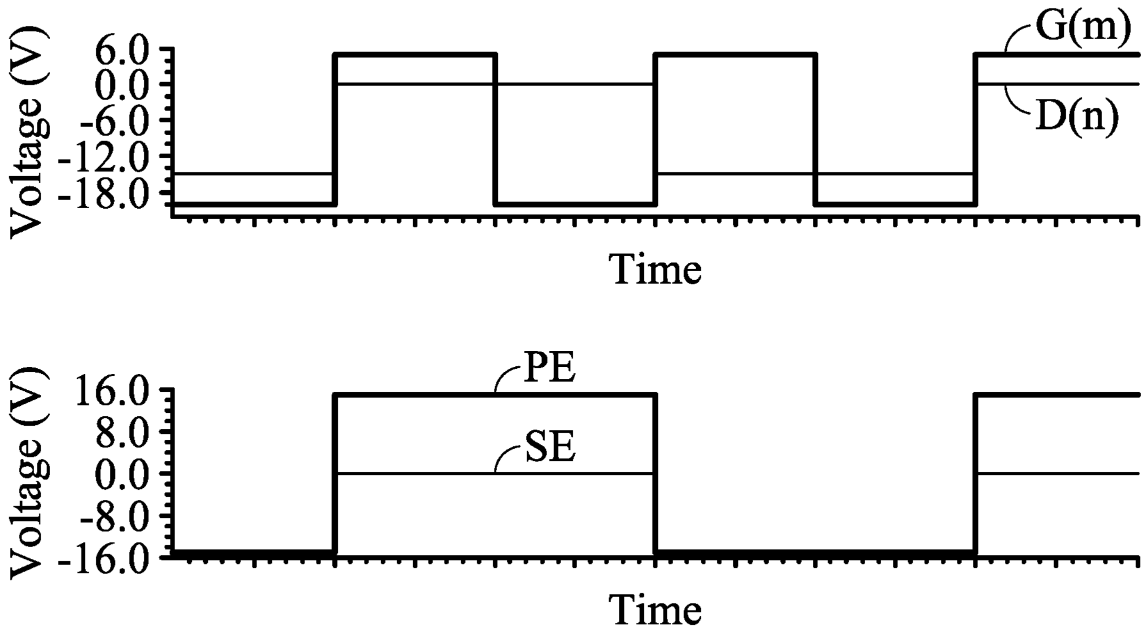
FIG. 4D shows the exemplary waveforms of the signals according to the first embodiment of the disclosure.

FIG. 4D shows the exemplary waveforms of the signals according to the first embodiment of the disclosure. In this embodiment, the voltage level of the gate driving signal G(m) on the gate line GL(m) may be −20V or 5V, the voltage level of the data driving signal D(n) on the data line DL(n) may be −15V or 0V, the voltage level of the input signal at the storage electrode terminal SE may be −15V or 0V and the voltage level of the output signal at the pixel electrode terminal PE may be 15V or 15V. As shown in the figure, the high level shifter is configured to pull up the high voltage level of the input signal from 0V to the level of the target high voltage, such as 15V.

Figure 5A:
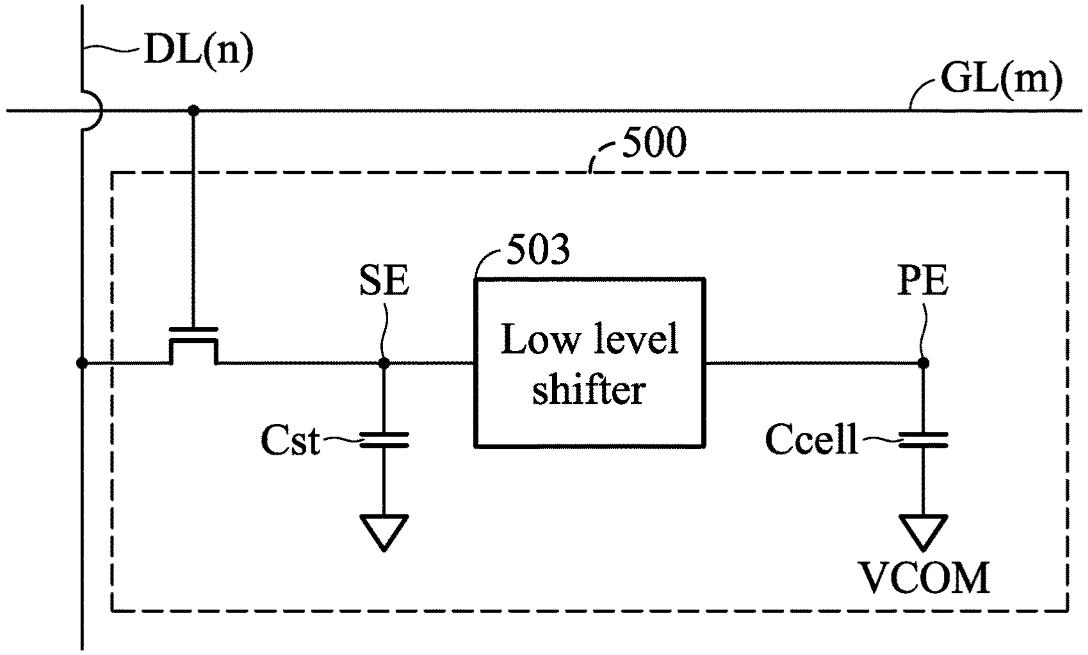
FIG. 5A is a circuit diagram of a pixel unit according to a second embodiment of the disclosure.
Figure 5B:
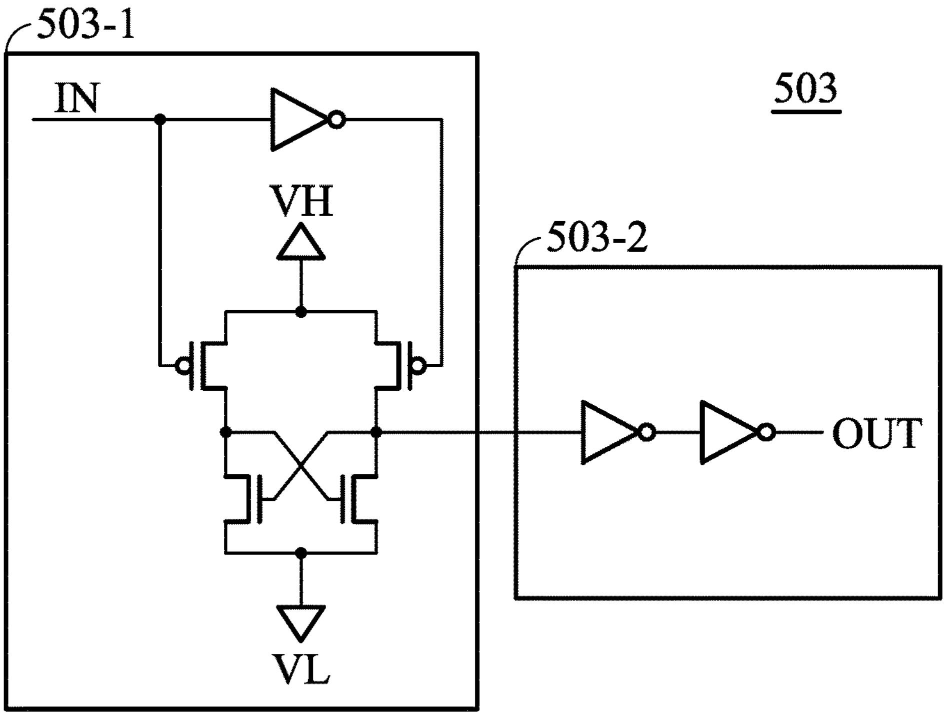
FIG. 5B is an exemplary circuit diagram of a low level shifter according to an embodiment of the disclosure.
Figure 5C:
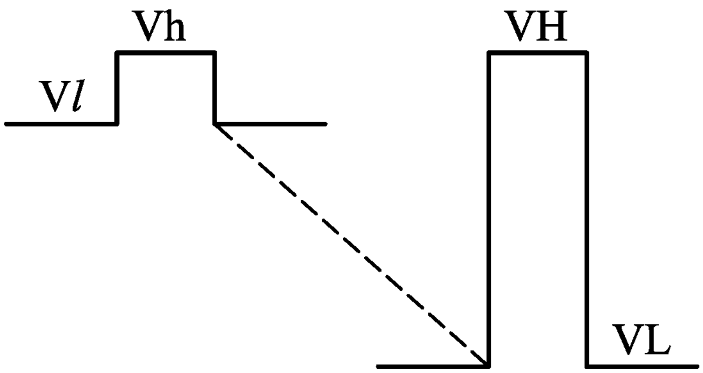
FIG. 5C is a schematic diagram showing the voltage levels of the input signal and the output signal of a low level shifter according to an embodiment of the disclosure.

FIG. 5A is a circuit diagram of a pixel unit according to a second embodiment of the disclosure. The pixel unit 500 may comprise a low level shifter 503. FIG. 5B is an exemplary circuit diagram of a low level shifter according to an embodiment of the disclosure. FIG. 5C is a schematic diagram showing the voltage levels of the input signal and the output signal of a low level shifter according to an embodiment of the disclosure. The low level shifter 503 may comprise a level shifter circuit unit 503-1 and a buffer circuit unit 503-2, where the buffer circuit unit 503-2 may be utilized to enhance the driving ability of the signal. The buffer circuit unit 503-2 may be an optional choice, that is, the low level shifter 503 may also not comprise the buffer circuit unit 503-2. In this embodiment, the voltage level of the signal received at the input terminal IN of the low level shifter 503 may be V1 or Vh, and the voltage level of the voltage-shifted signal generated at the output terminal OUT of the low level shifter 503 may be VL or VH. In this embodiment, the voltage VL may be set to the level of the target voltage VSL, for example, −15V, and the voltage VH may be set to the level of the target voltage VSH, for example, +15V. The high voltage level Vh of the input signal may already reach the level of the target voltage VSH. Therefore, in this embodiment, the low level shifter 503 may be utilized to adjust the low voltage level of the input signal, such that the high and low voltage levels of the voltage-shifted signal may be the same as the levels of the target voltages VSH and VSL.

Figure 5D:
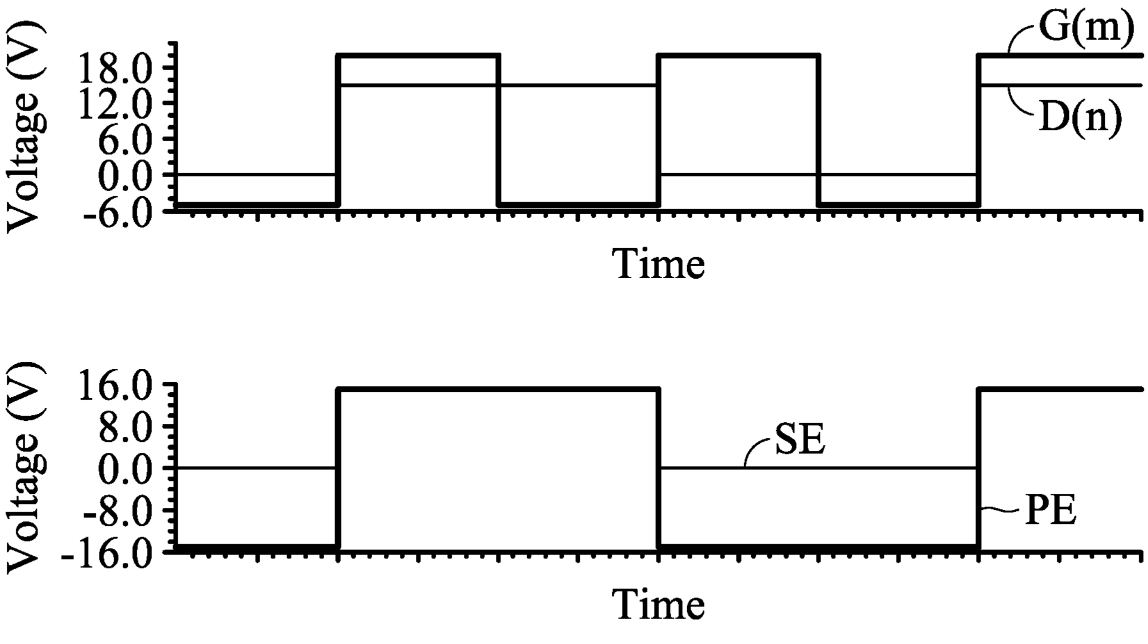
FIG. 5D shows the exemplary waveforms of the signals according to the second embodiment of the disclosure.

FIG. 5D shows the exemplary waveforms of the signals according to the second embodiment of the disclosure. In this embodiment, the voltage level of the gate driving signal G(m) on the gate line GL(m) may be −5V or 20V, the voltage level of the data driving signal D(n) on the data line DL(n) may be 0V or 15V, the voltage level of the input signal at the storage electrode terminal SE may be 0V or 15V and the voltage level of the output signal at the pixel electrode terminal PE may be −15V or 15V. As shown in the figure, the low level shifter is configured to pull down the low voltage level from 0V to the level of the target low voltage, such as −15V.

Figure 6A:
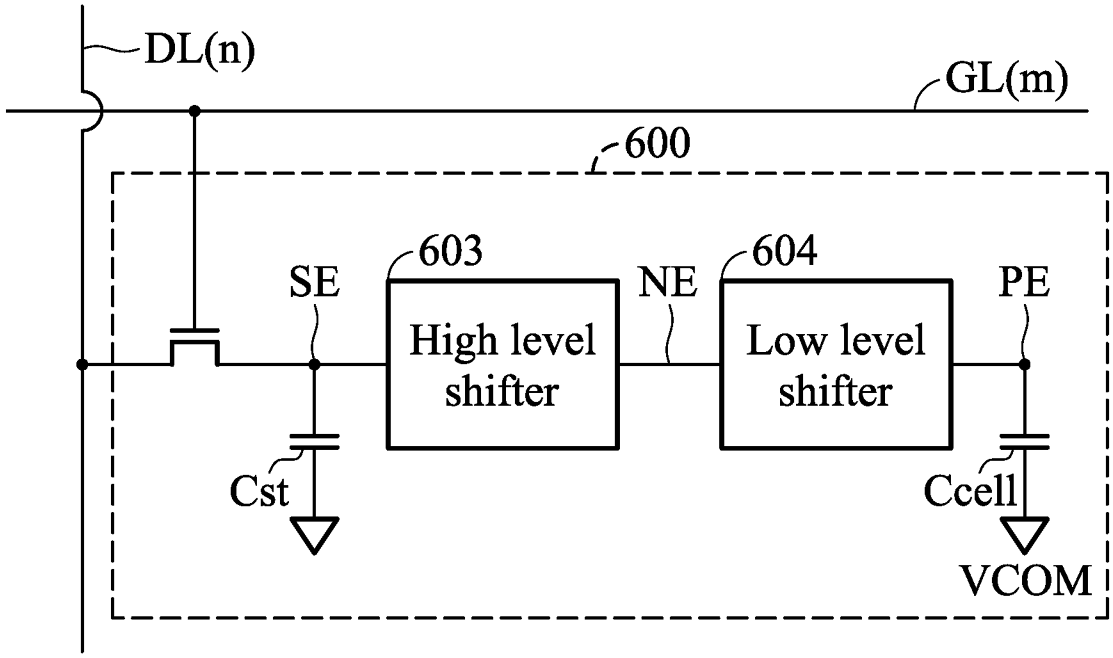
FIG. 6A is a circuit diagram of a pixel unit according to a third embodiment of the disclosure.

FIG. 6A is a circuit diagram of a pixel unit according to a third embodiment of the disclosure. The pixel unit 600 may comprise a high level shifter 603 and a low level shifter 604. The output terminal of the high level shifter 603 and the input terminal of the low level shifter 604 may be coupled to the terminal NE (note that in other embodiments, the positions of the high level shifter 603 and the low level shifter 604 may be exchanged, such that the output terminal of the low level shifter 604 and the input terminal of the high level shifter 603 may be coupled to the terminal NE). In this embodiment, the high level shifter 603 may be configured to adjust the high voltage level of the input signal and the low level shifter 604 may be configured to adjust the low voltage level of the input signal, such that the high and low voltage levels of the voltage-shifted signal may be the same as the levels of the target voltages VSH and VSL.

Figure 6B:
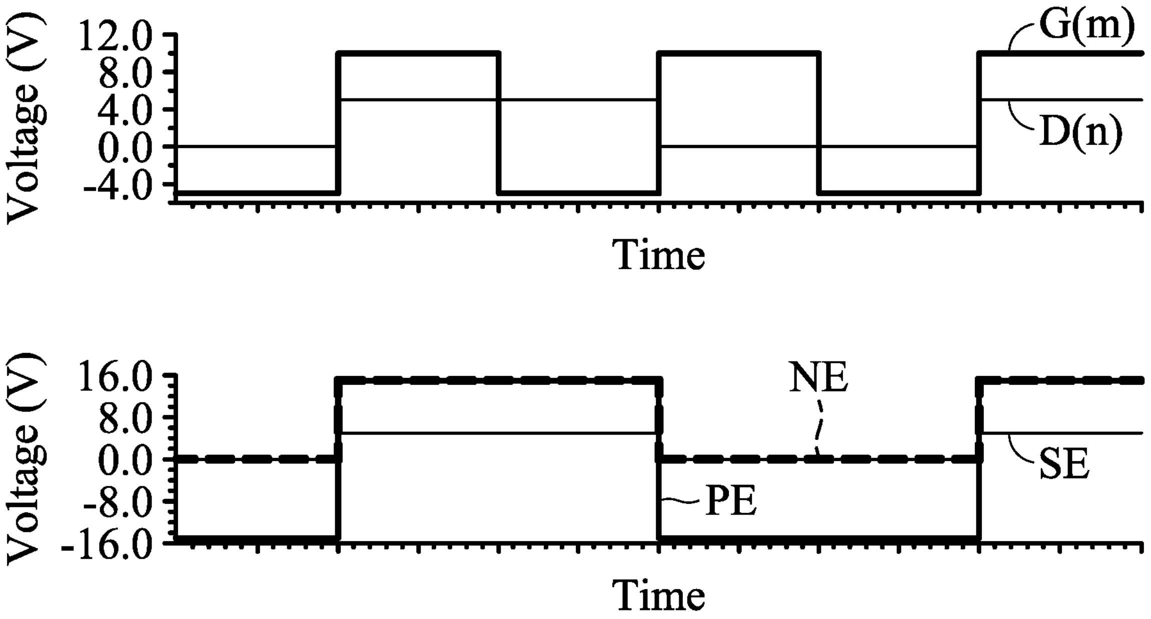
FIG. 6B shows the exemplary waveforms of the signals according to the third embodiment of the disclosure.

FIG. 6B shows the exemplary waveforms of the signals according to the third embodiment of the disclosure. In this embodiment, the voltage level of the gate driving signal G(m) on the gate line GL(m) may be −5V or 10V, the voltage level of the data driving signal D(n) on the data line DL(n) may be 0V or 5V, the voltage level of the input signal at the storage electrode terminal SE may be 0V or 5V, the voltage level of the input signal at the intermediate terminal NE may be 0V or 15V, and the voltage level of the output signal at the pixel electrode terminal PE may be −15V or 15V. As shown in the figure, the high voltage level of the input signal is pulled up from 5V to the level of the target high voltage, such as 15V, and the low voltage level of the input signal is pulled down from 0V to the level of the target low voltage, such as −15V.

Figure 7A:
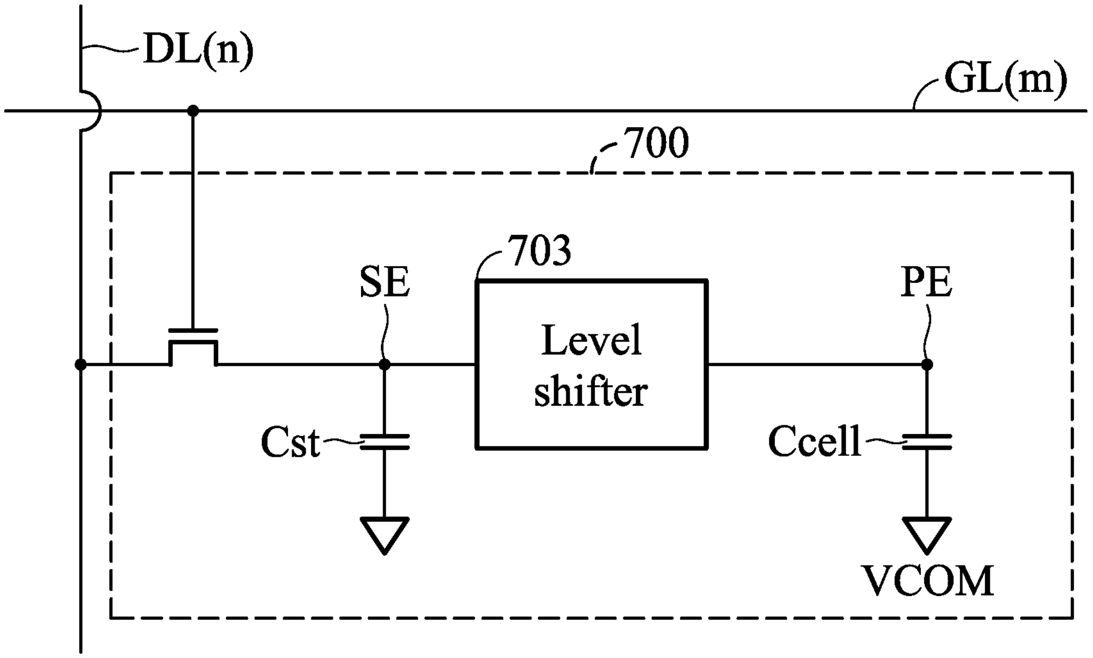
FIG. 7A is a circuit diagram of a pixel unit according to a fourth embodiment of the disclosure.
Figure 7B:
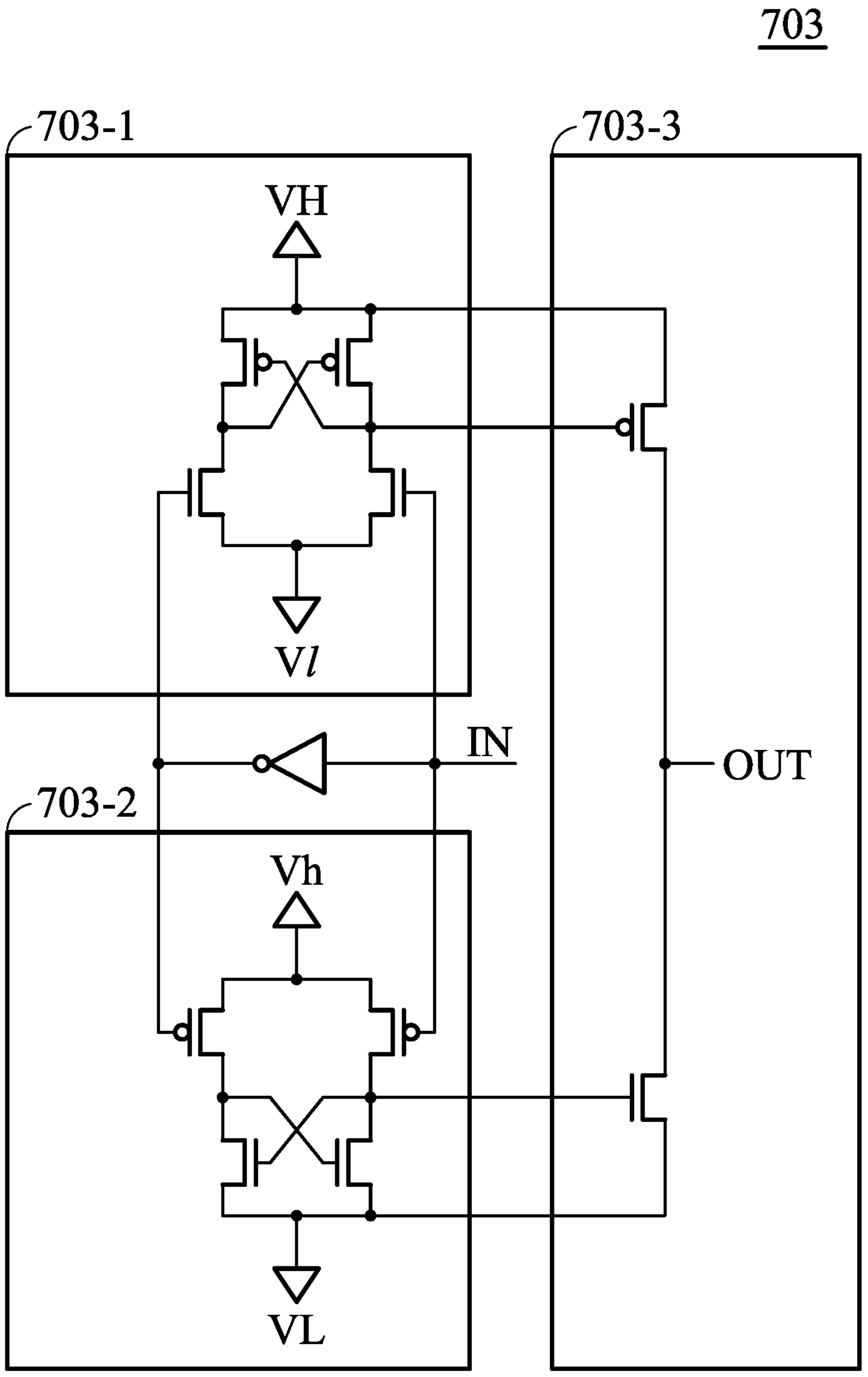
FIG. 7B is an exemplary circuit diagram of a level shifter according to an embodiment of the disclosure.
Figure 7C:
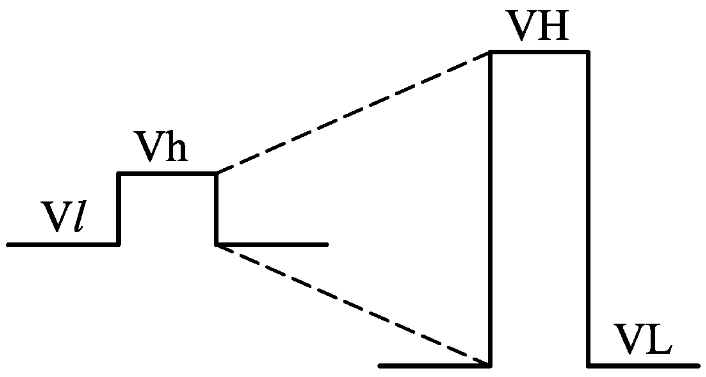
FIG. 7C is a schematic diagram showing the voltage levels of the input signal and the output signal of a level shifter according to an embodiment of the disclosure.

FIG. 7A is a circuit diagram of a pixel unit according to a fourth embodiment of the disclosure. The pixel unit 700 may comprise a level shifter 703. FIG. 7B is an exemplary circuit diagram of a level shifter according to an embodiment of the disclosure. FIG. 7C is a schematic diagram showing the voltage levels of the input signal and the output signal of a level shifter according to an embodiment of the disclosure. The level shifter 703 may comprise level shifter circuit units 703-1 and 703-2 and a buffer circuit unit 703-3, where the buffer circuit unit 703-3 may be utilized to enhance the driving ability of the signal. The buffer circuit unit 703-3 may be an optional choice, that is, the level shifter 703 may also not comprise the buffer circuit unit 703-3. In this embodiment, the level shifter 703 may be a combination of a high level shifter and a low level shifter, where the level shifter circuit unit 703-1 is configured to adjust the high voltage level of the input signal and the level shifter circuit unit 703-2 is configured to adjust the low voltage level of the input signal.

The voltage level of the signal received at the input terminal IN of the level shifter 703 may be Vl or Vh, and the voltage level of the voltage-shifted signal generated at the output terminal of the level shifter 703 may be VL or VH. In this embodiment, the voltage VL may be set to the level of the target voltage VSL, and the voltage VH may be set to the level of the target voltage VSH. Both the voltage levels Vl and Vh of the input signal do not reach the levels of the target voltages VSL and VSH. Therefore, in this embodiment, the level shifter 703 may be utilized to adjust the high voltage level and the low voltage level of the input signal, such that the high and low voltage levels of the voltage-shifted signal may be the same as the levels of the target voltages VSH and VSL.

The waveforms of the signals, such as the gate driving signal G(m), the data driving signal D(n), the input signal at the storage electrode terminal SE and the output signal at the pixel electrode terminal PE, in the fourth embodiment are similar to FIG. 6, and are omitted here for brevity.

Figure 8A:
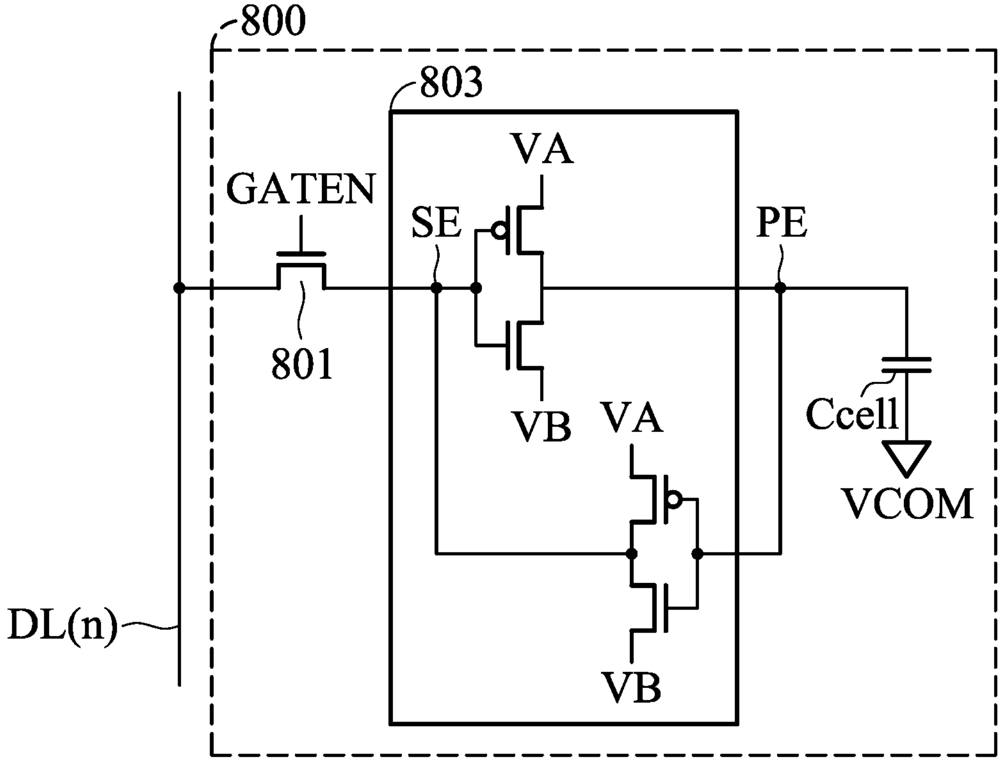
FIG. 8A is a circuit diagram of a pixel unit according to a fifth embodiment of the disclosure.

FIG. 8A is a circuit diagram of a pixel unit according to a fifth embodiment of the disclosure. In the fifth embodiment of the disclosure, the voltage maintenance circuit and the voltage level shifting circuit are integrated together. In other words, in this embodiment, the voltage level shifting circuit also has the function of voltage maintenance.

The voltage level shifting circuit 803 may comprise two inverter inversely coupled with each other, forming a latch for providing the voltage maintenance function. In this manner, the voltage at the storage electrode terminal SE can be kept. When the transistor 801 is turned on in response to the control voltage GATEN (that is the control voltage of the gate driving signal) on the gate line, the voltages at the storage electrode terminal SE and the pixel electrode terminal PE are controlled by the data driving signal D(n) on the data line DL(n). When the transistor 801 is turned off in response to the control voltage GATEN (that is, the transistor is not conducting), the levels of the control voltages VA and VB are controlled by the external circuit (not shown in the figure). By increasing the level of the control voltage VA and decreasing the level of the control voltage VB, the high voltage level and the low voltage level of the storage electrode terminal SE and the pixel electrode terminal PE will be adjusted, accordingly, achieving the level shifting function.

Figure 8B:
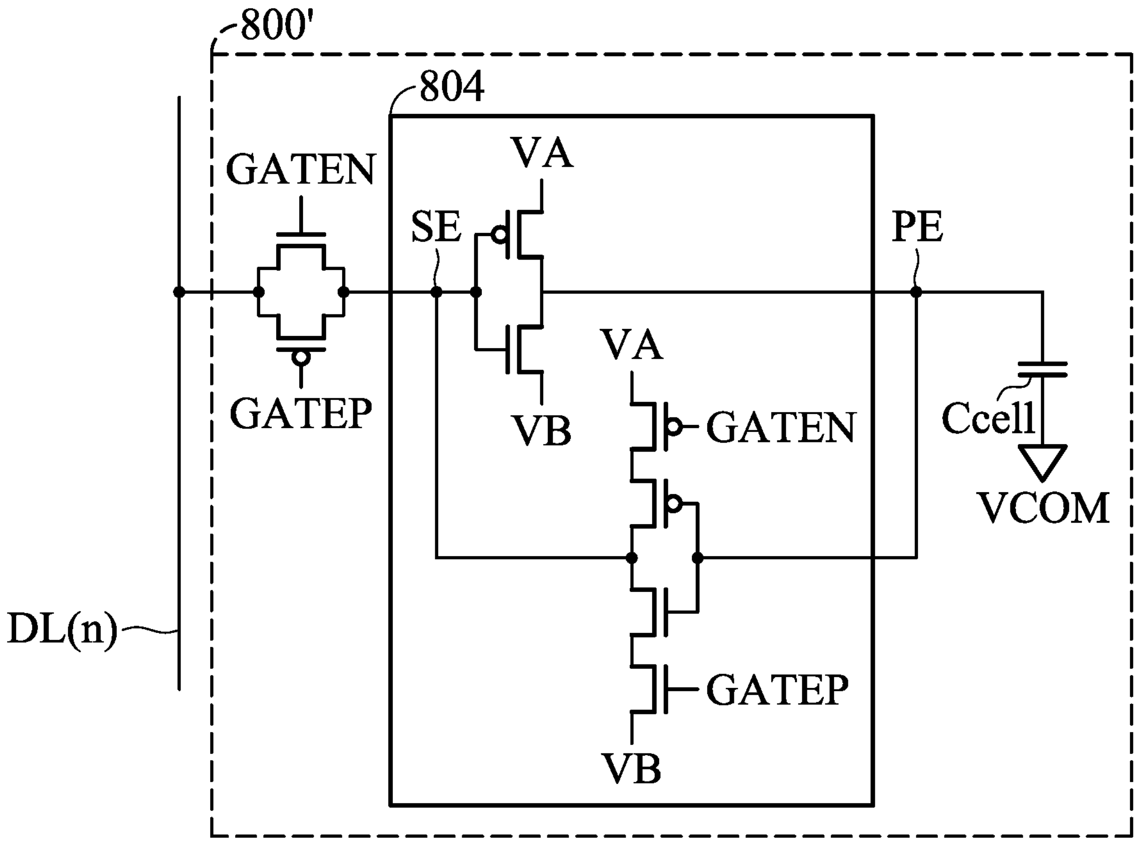
FIG. 8B is another circuit diagram of a pixel unit according to the fifth embodiment of the disclosure.

FIG. 8B is another circuit diagram of a pixel unit according to the fifth embodiment of the disclosure. The pixel unit 800' shown in FIG. 8B and the pixel unit 800 shown in FIG. 8A have similar structure, and the difference therebetween is that the switch circuit of the pixel unit 800' comprises two transistors, whose on-off status are respectively controlled by the control signals GATEN and GATEP. In addition, compared to the voltage level shifting circuit 803, the voltage level shifting circuit 804 further comprises two transistors, whose on-off status are respectively controlled by the control signals GATEN and GATEP. The phases of the control signal GATEN and the control signal GATEP are opposite to each other.

Figure 8C:
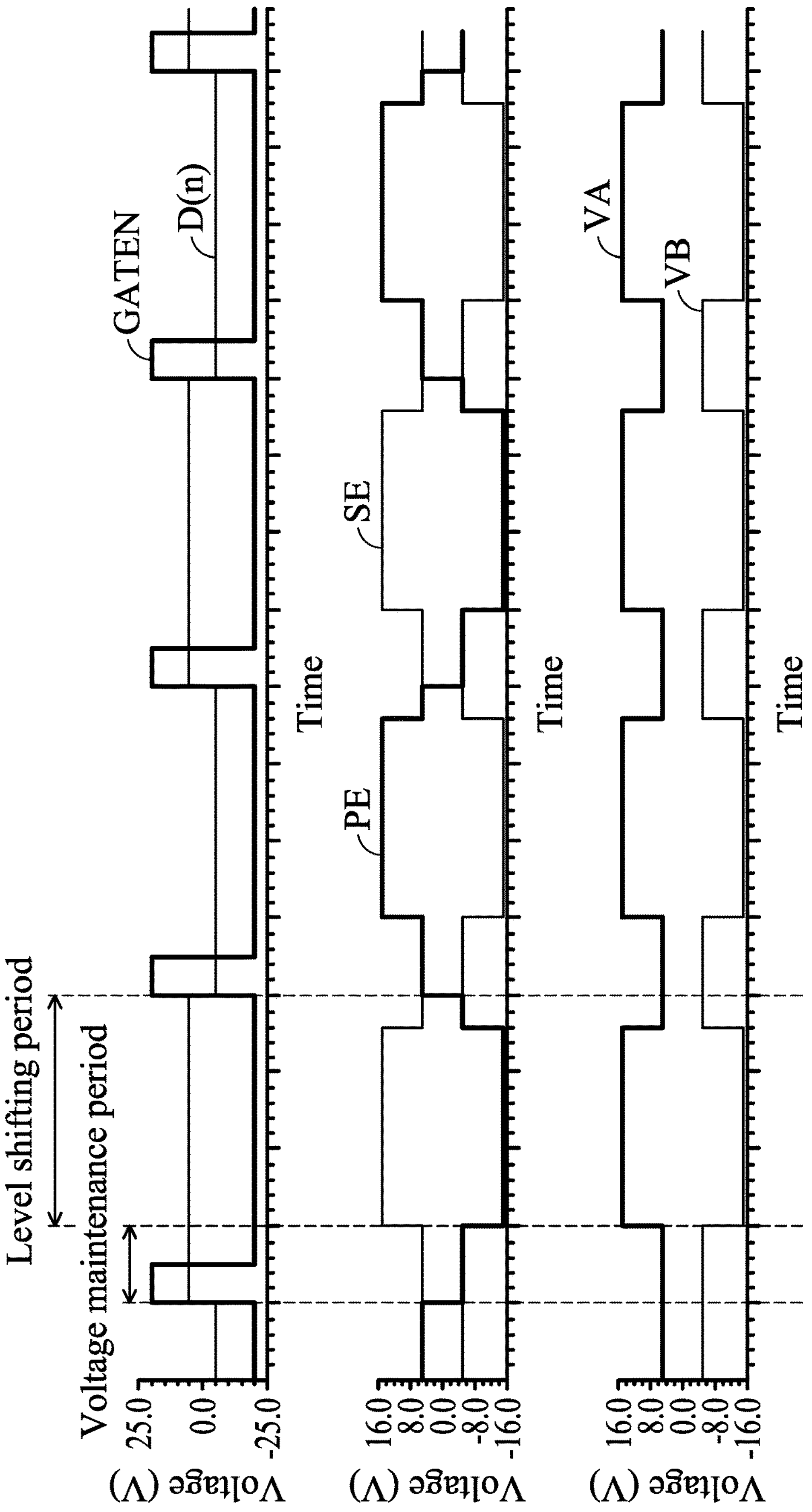
FIG. 8C shows the waveforms of the signals according to the fifth embodiment of the disclosure.

FIG. 8C shows the waveforms of the signals according to the fifth embodiment of the disclosure. As shown in the figure, during the voltage maintenance period, when the gate pulse on the gate line arrives, the voltages at the storage electrode terminal SE and the pixel electrode terminal PE are controlled by the data driving signal D(n) on the data line DL(n) and are kept by the latch. After the end of the gate pulse, the level shifting period is entered. By pulling up the level of the control voltage VA and the pulling down the level of the control voltage VB, the high voltage level at the storage electrode terminal SE and the pixel electrode terminal PE are pulled up and the low voltage level at the storage electrode terminal SE and the pixel electrode terminal PE are pulled down, accordingly, thereby achieving the level shifting function.

According to the second aspect embodiment of the disclosure, a portion of the voltage level shifting circuit is configured inside of the pixel array, and another portion of the voltage level shifting circuit is configured outside of the pixel array. To be more specific, a portion of the voltage level shifting circuit is configured inside of the pixel unit of the pixel array, and another portion of the voltage level shifting circuit is configured outside of the pixel unit. In the following embodiments, for simplicity, only one of the pixel units 200 is shown as an example.

Figure 9A:
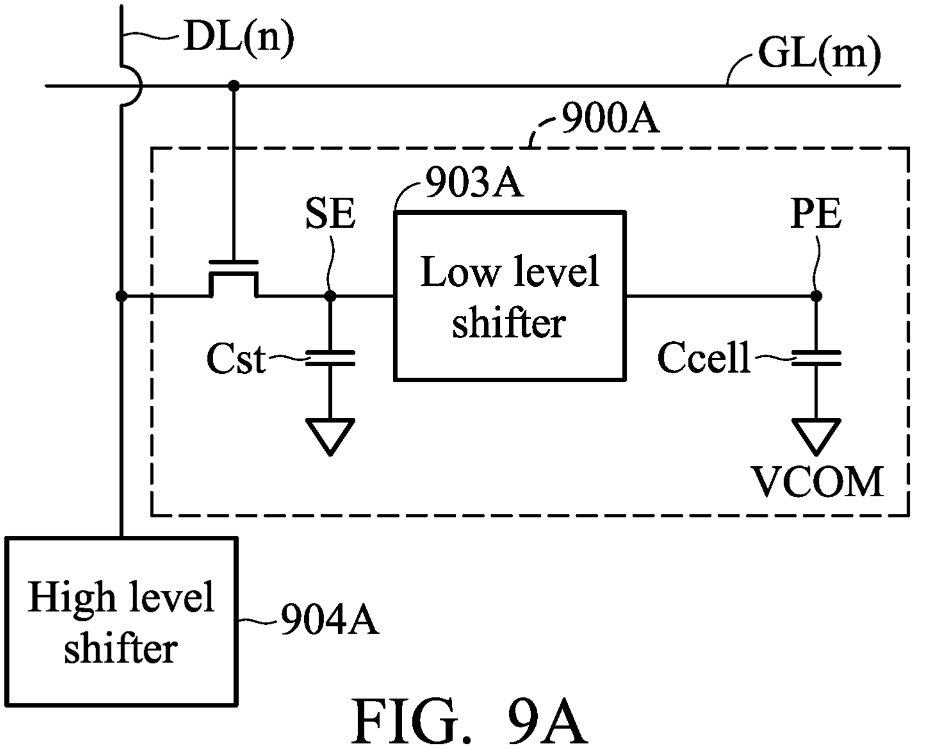
FIG. 9A is a circuit diagram of a pixel unit according to a sixth embodiment of the disclosure.

FIG. 9A is a circuit diagram of a pixel unit according to a sixth embodiment of the disclosure. In this embodiment, the pixel unit 900A may comprise a low level shifter 903A (the first voltage level shifting circuit), wherein the low level shifter 903A may be configured inside of the pixel unit 900A of the pixel array. The circuit and operations of the low level shifter 903A are similar to the descriptions of FIG. 5A-5D, and are omitted here for brevity. In addition, the display panel may further comprise a high level shifter 904A (the second voltage level shifting circuit). The high level shifter 904A may be coupled between the data driving circuit and the pixel unit 900A and may be coupled to each data line for adjusting the voltage level of the data driving signal providing to the corresponding data line. The circuit and operations of the high level shifter 904A are similar to the descriptions of FIG. 4A-4D, and are omitted here for brevity.

According to an embodiment of the disclosure, the voltage level of the data driving signal is 0V or 5V. Via the adjustment of the high level shifter 904A, the high voltage level of the data driving signal may be pulled up to 15V. Therefore, the voltage level of the gate driving signal G(m) on the gate line GL(m) is −5V or 20V, the voltage level of the data driving signal D(n) on the data line DL(n) is 0V or 15V and the voltage level of the input signal at the storage electrode terminal SE is 0V or 15V. In addition, via the adjustment of the low level shifter 903A, the voltage level of the output signal at the pixel electrode terminal PE is −15V or 15V.

Figure 9B:
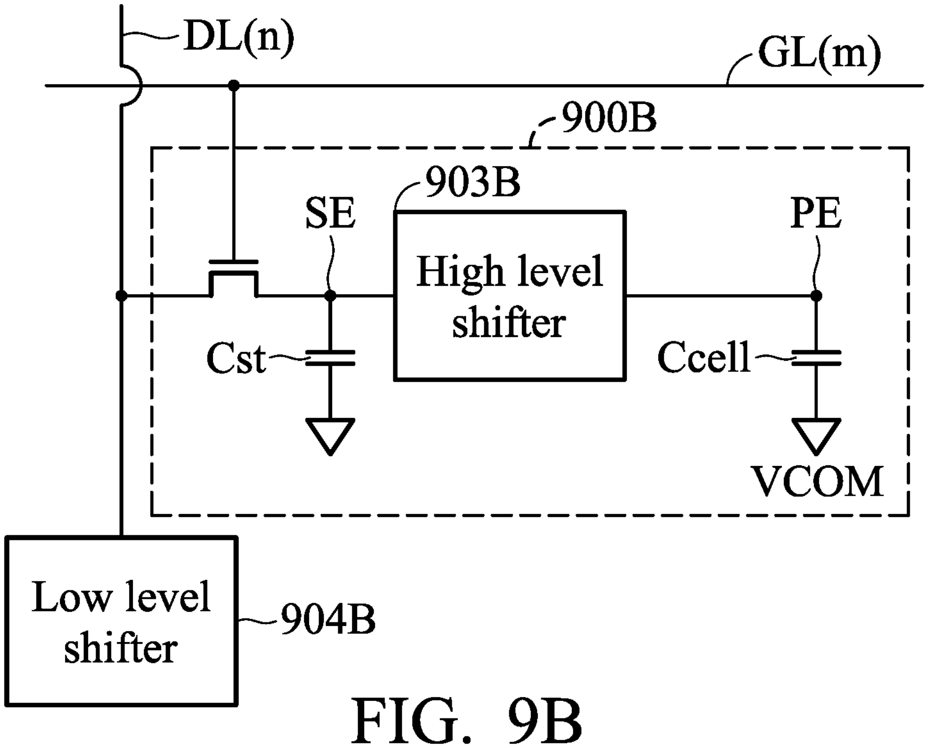
FIG. 9B is a circuit diagram of a pixel unit according to a seventh embodiment of the disclosure.

FIG. 9B is a circuit diagram of a pixel unit according to a seventh embodiment of the disclosure. In this embodiment, the pixel unit 900B may comprise a high level shifter 903B (the first voltage level shifting circuit), wherein the high level shifter 903B may be configured inside of the pixel unit 900B of the pixel array. The circuit and operations of the high level shifter 903B are similar to the descriptions of FIG. 4A~4D, and are omitted here for brevity. In addition, the display panel may further comprise a low level shifter 904B (the second voltage level shifting circuit). The low level shifter 904B may be coupled between the data driving circuit and the pixel unit 900B and may be coupled to each data line for adjusting the voltage level of the data driving signal providing to the corresponding data line. The circuit and operations of the low level shifter 904B are similar to the descriptions of FIG. 5A~5D, and are omitted here for brevity.

According to an embodiment of the disclosure, the voltage level of the data driving signal is −5V or 0V. Via the adjustment of the low level shifter 904B, the low voltage level of the data driving signal may be pulled down to −15V. Therefore, the voltage level of the gate driving signal G(m) on the gate line GL(m) is −20V or 5V, the voltage level of the data driving signal D(n) on the data line DL(n) is −15V or 0V and the voltage level of the input signal at the storage electrode terminal SE is −15V or 0V. In addition, via the adjustment of the high level shifter 903B, the voltage level of the output signal at the pixel electrode terminal PE is −15V or 15V.

According to the third aspect embodiment of the disclosure, the voltage level shifting circuit may be configured outside of the pixel array. For example, the voltage level shifting circuit may be coupled between the data driving circuit and the pixel unit, and may be coupled between the gate driving circuit and the pixel unit.

Figure 10:
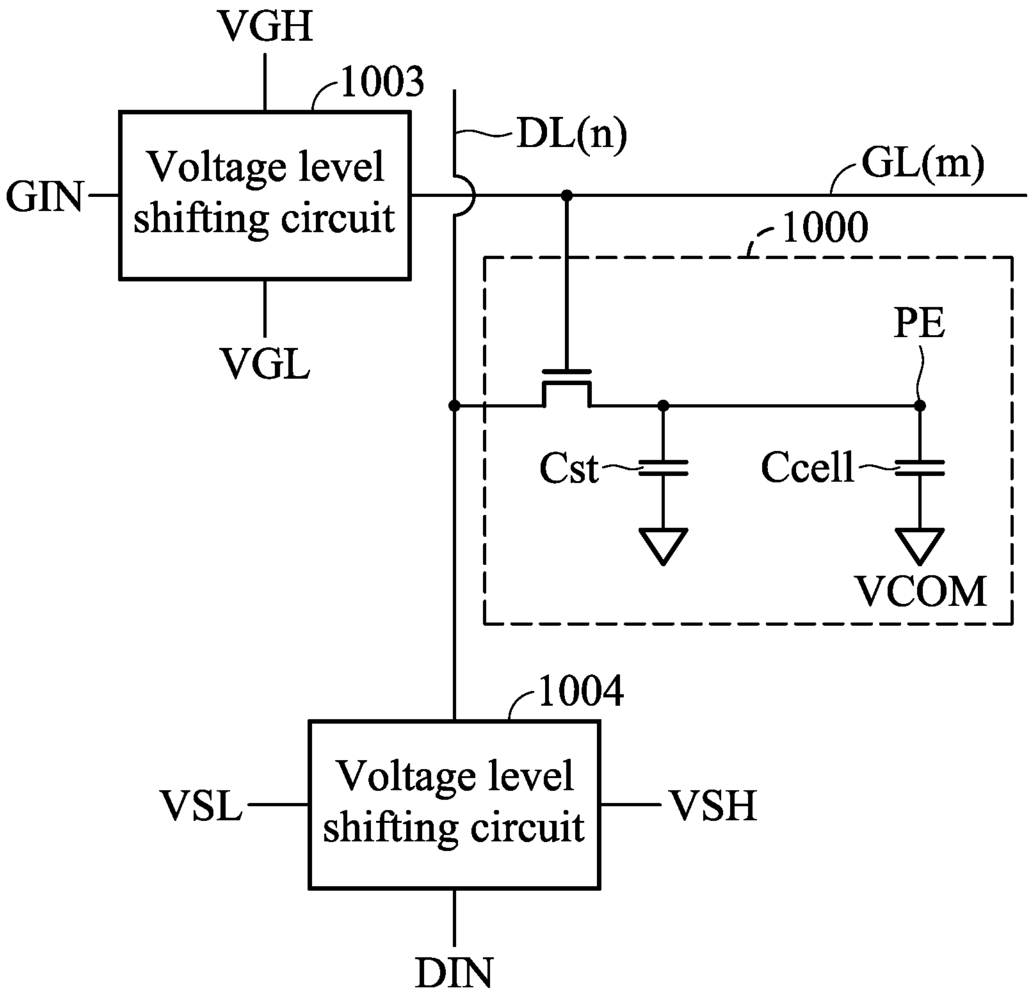
FIG. 10 is a circuit diagram of a pixel unit according to an eighth embodiment of the disclosure.

FIG. 10 is a circuit diagram of a pixel unit according to an eighth embodiment of the disclosure. In this embodiment, no voltage level shifting circuit is configured inside of the pixel unit 1000. The display device may comprise a plurality of voltage level shifting circuits coupled between the data driving circuit and the pixel units and a plurality of voltage level shifting circuits coupled between the gate driving circuit and the pixel units. According to an embodiment of the disclosure, there may be one voltage level shifting circuit configured on each gate line. Similarly, there may be one voltage level shifting circuit configured on each data line. As shown in the figure, the voltage level shifting circuit 1003 may be disposed on the gate line GL(m) and configured to adjust the voltage level of the gate driving signal GIN provided to the gate line GL(m), such that the voltage-shifted gate driving signal can have the high voltage level VGH and the low voltage level VGL. The voltage level shifting circuit 1004 may be disposed on the data line DL(n) and configured to adjust the voltage level of the data driving signal DIN provided to the data line DL(n), such that the voltage-shifted data driving signal can have the high voltage level VSH and the low voltage level VSL.

According to the embodiment of the disclosure, as long as the level of the voltage at the pixel electrode terminal PE can be shifted to the target high voltage level or the target low voltage level required by the display unit, the voltage level shifting circuits 1003 and 1004 can be any kind of level shifter as discussed above, depending on the voltage level of the gate driving signal GIN output by the gate driving circuit and the data driving signal DIN output by the data driving circuit.

According to the fourth aspect embodiment of the disclosure, after the image data is written into each pixel unit, a post charge driving circuit may be utilized to further control the voltage at the pixel electrode terminal PE, so as to reduce the power consumption of the display device.

For example, in the display panel embodiments of the disclosure, due to the physical characteristic of the display unit, once the image data has been written to the display unit, as long as content of the image data is not changed, the voltage at the pixel electrode terminal PE can be pulled down to 0V, so as to reduce the power consumption of the display device. Meanwhile, the display units can keep displaying the corresponding image data.

Figure 11:
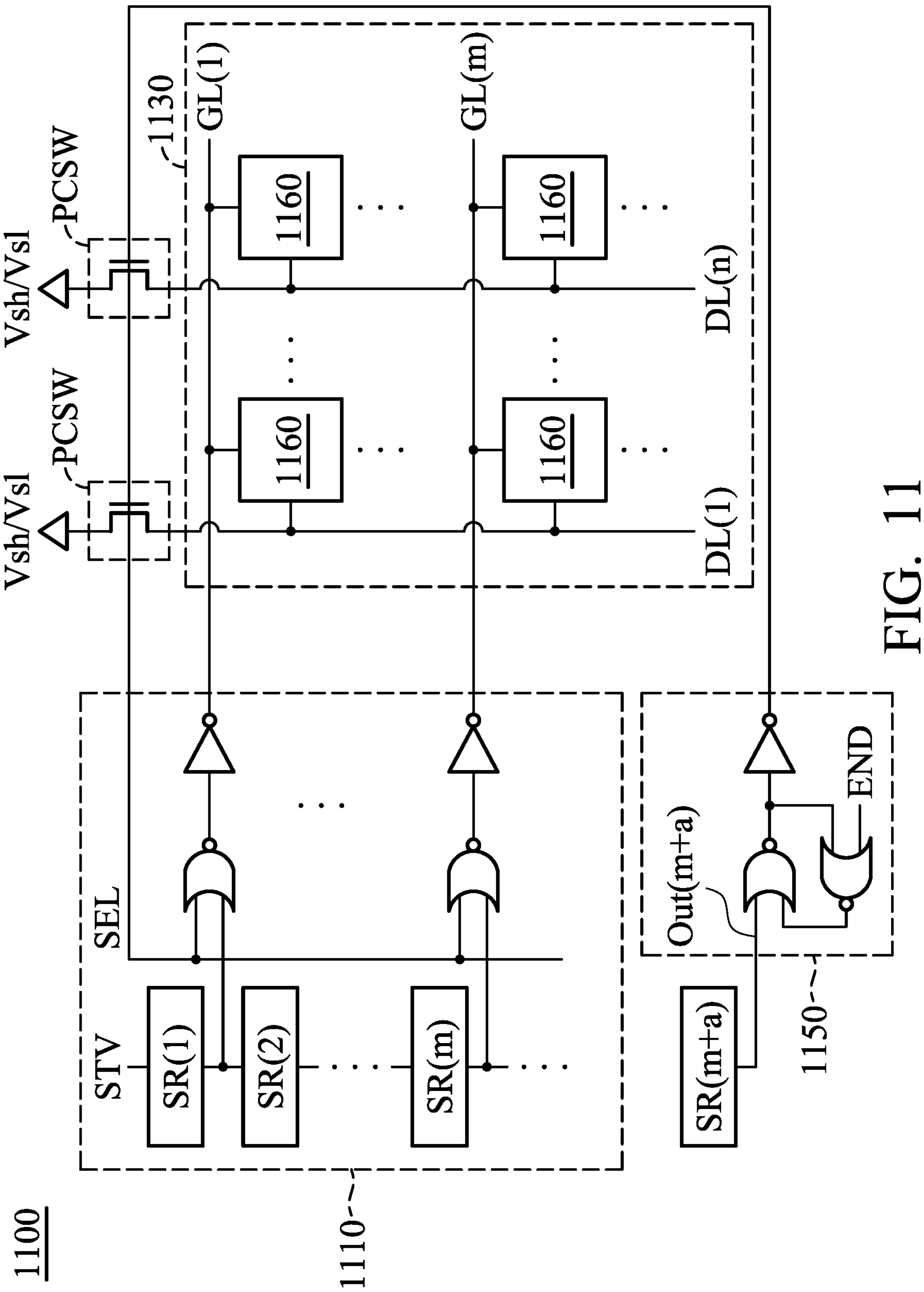
FIG. 11 is an exemplary circuit diagram of a portion of the display device according to a ninth embodiment of the disclosure.

FIG. 11 is an exemplary circuit diagram of a portion of the display device according to a ninth embodiment of the disclosure. Besides the gate driving circuit 1110, the pixel array 1130, the display device 1100 may further comprise a post charge driving circuit 1150 and a plurality of post charge switch circuits PCSW. The pixel array 1130 may comprise a plurality of pixel units 1160. In this embodiment, each pixel unit 1160 may comprise a voltage level shifting circuit as the first to the seventh embodiment as illustrated above. The gate lines GL(1)~GL(m) may be respectively coupled to a row of pixel units. The data lines DL(1)~DL(n) may be respectively coupled to a column of pixel units. The gate driving circuit 1110 may comprise a plurality of shift registers SR(1), SR(2), . . . SR(m), for generating corresponding gate driving signal on each gate line.

According to the fourth aspect embodiment of the disclosure, the display device 1110 may comprise one or more dummy shift registers SR(m+a), where a may be a positive integer greater than or equal to 1. The first stage dummy shift register may be coupled to the last stage shift register SR(m) of the gate driving circuit 1110, and the remaining dummy shift register (it there is any) may be sequentially coupled to the first stage dummy shift register. According to the fourth aspect embodiment of the disclosure, the post charge driving circuit 1150 is coupled to the pixel 1130 and configured to output a selection signal SEL. The output of selection signal SEL is triggered based on the output signal Out(m+a) of the dummy shift register SR(m+a), and is ended based on the ending signal END.

According to the fourth aspect embodiment of the disclosure, each post charge switch circuit PCSW is coupled to one of the data lines DL(1)~DL(n), wherein each post charge switch circuit PCSW may receive the selection signal SEL and change the on-off status thereof in response to the selection signal.

In addition, according to the fourth embodiment of the disclosure, the gate driving circuit 1110 may also receive the selection signal SEL and during the pixel electrode maintenance period, the gate driving circuit 1110 is configured to generate a plurality of corresponding control pulses on the gate lines GL(1)~GL(m) in response to the selection signal SEL. To be more specific, during a data writing period, the gate driving circuit 1110 is configured to sequentially generate a corresponding gate pulse on each gate line GL(1)~GL(m), and the data lines DL(1)~DL(n) are configured to sequentially provide the corresponding data driving signal to the corresponding display unit in the pixel array 1130, for writing the image data to the pixel units 1160. After the data writing period has ended, the pixel electrode maintenance period is entered. During the pixel electrode maintenance period, the gate driving circuit 1110 is further configured to generate the corresponding control pulses on the gate lines GL(1)~GL(m) according to the selection signal SEL, so as to turn on the corresponding switch circuit in the pixel unit 1160 (for example, the transistor is conducting). In this manner, the voltage on the data line DL(1)~DL(n) can be transmitted to the storage electrode terminal SE, again. In the embodiment of the disclosure, the voltage levels of the control pulses and the gate pulses are the same. However, the disclosure is not limited thereto.

According to the fourth aspect embodiment of the disclosure, the post charge driving circuit PCSW may be a transistor comprising a first terminal configured to receive a predetermined voltage Vsh or Vsl, a second terminal coupled to the corresponding data line and a control terminal configured to receive the selection signal SEL. During the pixel electrode maintenance period, the post charge switch circuit PCSW is turned on (for example, the transistor shown in the figure is conducting) in response to the selection signal SEL, and provides the predetermined voltage Vsh or Vsl to the corresponding data line as the corresponding data driving signal transmitted on the data line.

In the embodiment of the fourth aspect embodiment of the disclosure, the setting of the predetermined voltage (Vsh or Vsl) may be determined based on the type of voltage level shifting circuit comprised in each pixel unit. For example, suppose that the voltage level shifting circuit comprised in the pixel unit is a high level shifter utilized to adjust the high voltage level of the input signal, the level of the predetermined voltage may be set to the high voltage level Vsh of the data driving signal output by the data driving circuit during the data writing period. Since the high level shifter comprised in the pixel unit may receive a target voltage (for example, the target high voltage VSH) and adjust the voltage level of the data driving signal provided to the corresponding display unit according to the target voltage, in the embodiment of the fourth aspect embodiment of the disclosure, during the pixel electrode maintenance period, the level of the target voltage will be adjusted by the external circuit, so as to reduce the power consumption of the display device.

For example, during the pixel electrode maintenance period, the post charge switch circuit PCSW is turned on in response to the selection signal SEL (for example, the transistor shown in the figure is conducting), and provides the predetermined voltage Vsh to the corresponding data line, and the predetermined voltage Vsh is further provided to the storage electrode terminal SE of the pixel unit. At this time, the level of the target voltage VSH is set to the same voltage level as the common voltage, for example, 0V. One terminal of the display unit may receive (that is, coupled to) the common voltage VCOM, another terminal is coupled to the pixel electrode terminal PE, and the voltage level shifting circuit comprised in the pixel unit will shift the voltage level at the pixel electrode terminal PE to the level of the target voltage VSH based on the voltage level Vsh of the storage electrode SE. Therefore, when the level of the target voltage VSH is set to the same voltage level as the common voltage VCOM during the pixel electrode maintenance period, the electric field between two terminals of the display unit is 0, so as to reduce the power consumption of the display device.

Figure 12A:
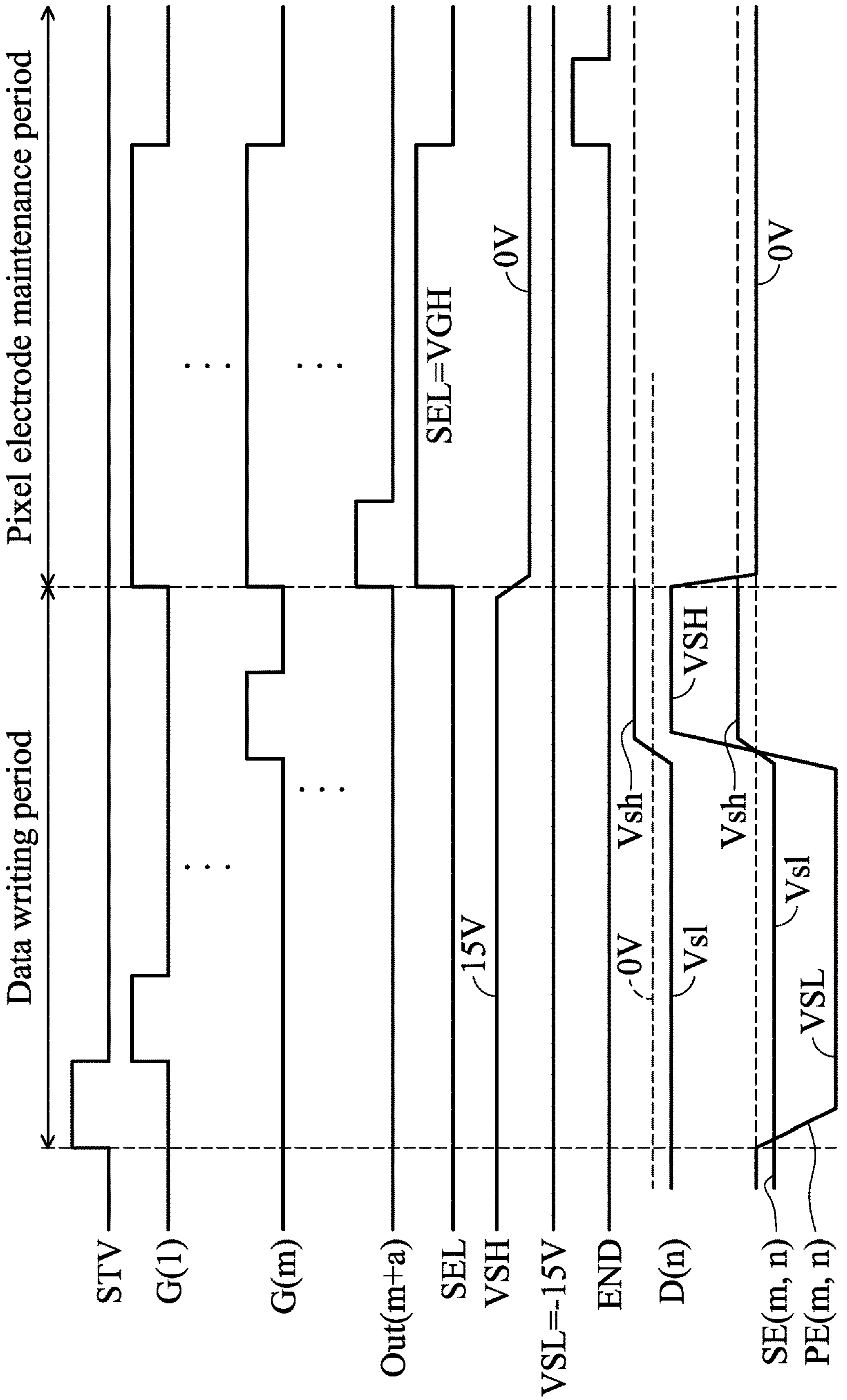
FIG. 12A is a diagram showing the exemplary waveforms of the signals according to the fourth aspect embodiment of the disclosure.

FIG. 12A a diagram showing the exemplary waveforms of the signals according to the fourth aspect embodiment of the disclosure. In this embodiment, the predetermined voltage received by the post charge switch circuit PCSW is set to the high voltage level Vsh. As shown in the figure, when the start pulse STV arrives, the data writing period is entered, corresponding gate pulses are sequentially generated in the gate driving signal G(1)~G(m) and the data driving signals D(1)~D(n) on the data lines DL(1)~DL(n) are sequentially provided to the corresponding pixel unit in the pixel array 1130, so as to write the image data to the pixel unit 1160. After the data writing period has ended, the pixel electrode maintenance period is entered. The post charge driving circuit 1150 is triggered by the output signal Out(m+a) of the dummy shift register SR(m+a) to generate the pulse of the selection signal SEL (for example, pulling high the voltage of the selection signal SEL to VGH). During the pixel electrode maintenance period, the gate driving circuit 1110 generates the corresponding control pulses on the gate driving signals G(1)~G(m) (for example, voltages of the gate driving signals G(1)~G(m) are pulled high during the pixel electrode maintenance period) in response to the selection signal SEL, so as to turn on the corresponding switch circuit in the pixel unit 1160 (for example, the transistor is conducting) and make the voltage on the data lines DL(1)~DL(n) to be transferred to the storage electrode terminal SE, again.

At the same time, the post charge switch circuit PCSW is turned on (for example, the transistor is conducting) in response to the selection signal SEL, and provides the predetermined voltage Vsh to the corresponding data line as the data driving signal transmitted on the corresponding data line. Meanwhile, since the corresponding switch circuit in the pixel unit 1160 is turned on, the voltage on the data lines DL(1)~DL(n) can be transferred to the storage electrode terminal SE, again. Since the pixel unit comprises a high level shifter for adjusting the high voltage level of the input signal, the voltage at the pixel electrode terminal PE will be adjusted to level of the target voltage VSH because the level of the predetermined voltage is set to the high voltage level Vsh. Therefore, in the fourth aspect embodiment, when the level of the target voltage VSH is adjusted to the same level, such as 0V shown in the figure, as the common voltage VCOM during the pixel electrode maintenance period, the electric field between two terminals of the display unit is 0, so as to reduce the power consumption of the display device.

Similarly, suppose that the pixel unit comprises a low level shifter for adjusting the low voltage level of the input signal, the predetermined voltage may be set to the low voltage level Vsl of the data driving signal output by the data driving circuit during the data writing period. Since the low level shifter comprised in the pixel unit may receive a target voltage (for example, the target low voltage VSL) and adjust the voltage level of the data driving signal provided to the corresponding display unit according to the target voltage, in the embodiment of the fourth aspect embodiment of the disclosure, during the pixel electrode maintenance period, the level of the target voltage VSL will be set to the same level as the common voltage VCOM, so as to reduce the power consumption of the display device.

For example, during the pixel electrode maintenance period, the post charge switch circuit PCSW is turned on (for example, the transistor is conducting) in response to the selection signal SEL, and provides the predetermined voltage Vsl to the corresponding data line, and the predetermined voltage Vsl is further provided to the storage electrode terminal SE of the pixel unit. At this time, the level of the target voltage VSL is set to the same voltage level as the common voltage VCOM, for example, 0V. One terminal of the display unit may receive (that is, coupled to) the common voltage VCOM, another terminal is coupled to the pixel electrode terminal PE, and the voltage level shifting circuit comprised in the pixel unit will shift the voltage level at the pixel electrode terminal PE to the level of the target voltage VSL based on the voltage level Vsl at the storage electrode terminal SE. Therefore, when the level of the target voltage VSL is set to the same voltage level as the common voltage VCOM during the pixel electrode maintenance period, the electric field between two terminals of the display unit is 0, so as to reduce the power consumption of the display device.

Figure 12B:
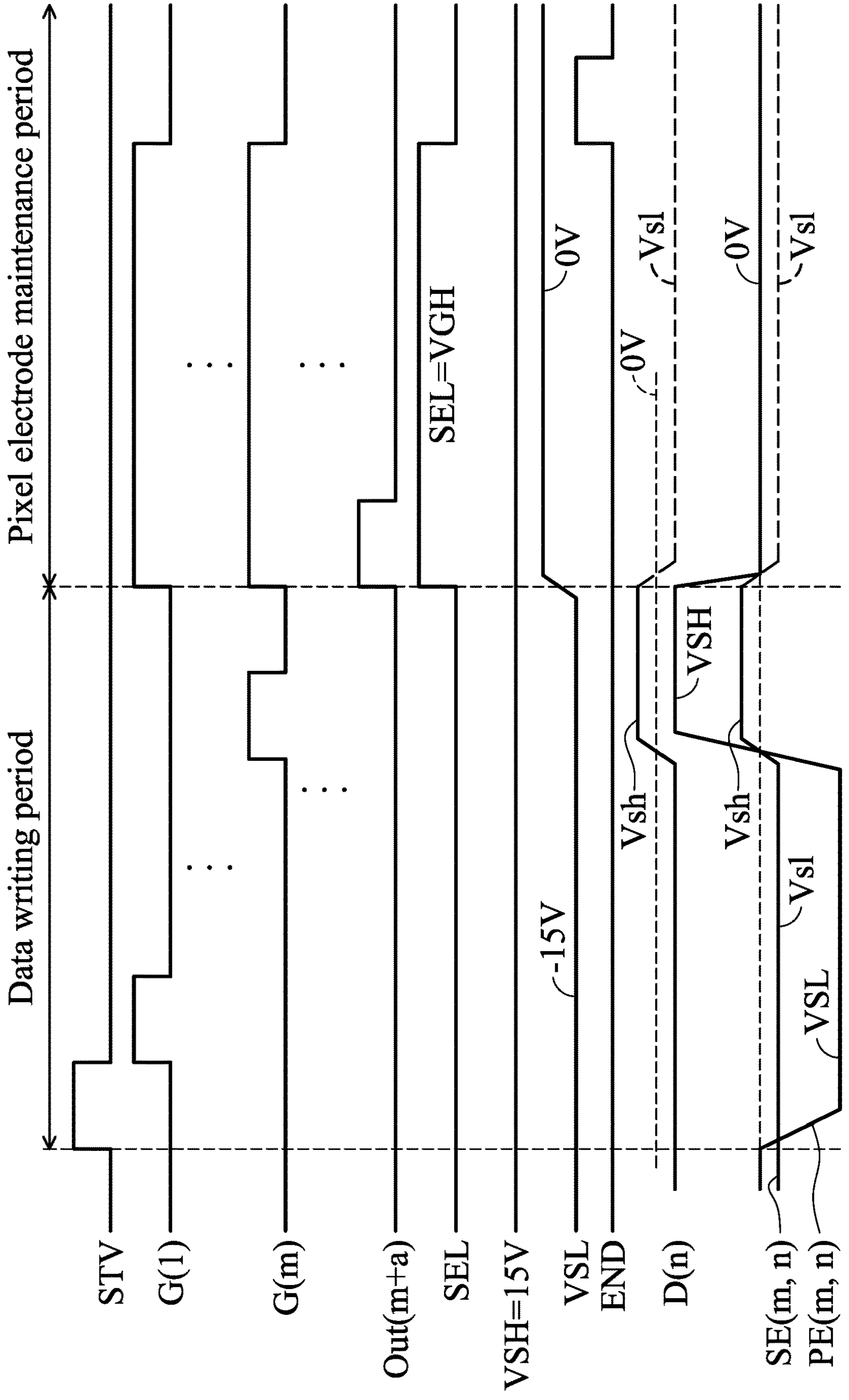
FIG. 12B is another diagram showing the exemplary waveforms of the signals according to the fourth aspect embodiment of the disclosure.

FIG. 12B is another diagram showing the exemplary waveforms of the signals according to the fourth aspect embodiment of the disclosure. In this embodiment, the predetermined voltage received by the post charge switch circuit PCSW is set to the low voltage level Vsl. As shown in the figure, when the start pulse STV arrives, the data writing period is entered, corresponding gate pulses are sequentially generated in the gate driving signal G(1)~G(m) and the data driving signals D(1)~D(n) on the data lines DL(1)~DL(n) are sequentially provided to the corresponding pixel unit in the pixel array 1130, so as to write the image data to the pixel unit 1160. After the data writing period has ended, the pixel electrode maintenance period is entered. The post charge driving circuit 1150 is triggered by the output signal Out(m+a) of the dummy shift register SR(m+a) to generate the pulse of the selection signal SEL (for example, pulling high the voltage of the selection signal SEL to VGH). During the pixel electrode maintenance period, the gate driving circuit 1110 generates the corresponding control pulses on the gate driving signals G(1)~G(m) (for example, voltages of the gate driving signals G(1)~G(m) are pulled high during the pixel electrode maintenance period) in response to the selection signal SEL, so as to turn on the corresponding switch circuit in the pixel unit 1160 (for example, the transistor is conducting) and transfer the voltage on the data lines DL(1)~DL(n) to the storage electrode terminal SE again.

At the same time, the post charge switch circuit PCSW is turned on (for example, the transistor is conducting) in response to the selection signal SEL, and provides the predetermined voltage Vsl to the corresponding data line as the data driving signal transmitted on the corresponding data line. Meanwhile, since the corresponding switch circuit in the pixel unit 1160 is turned on, the voltage on the data lines DL(1)~DL(n) can be transferred to the storage electrode terminal SE, again. Since the pixel unit comprises a low level shifter for adjusting the low voltage level of the input signal, the voltage at the pixel electrode terminal PE is pulled down to the target voltage VSL because the level of the predetermined voltage is set to the low voltage level Vsl. Therefore, in the fourth aspect embodiment, when the level of the target voltage VSL is adjusted to the same level, such as 0V shown in the figure, as the common voltage VCOM during the pixel electrode maintenance period, the electric field between two terminals of the display unit is 0, so as to reduce the power consumption of the display device.

Figure 13A:
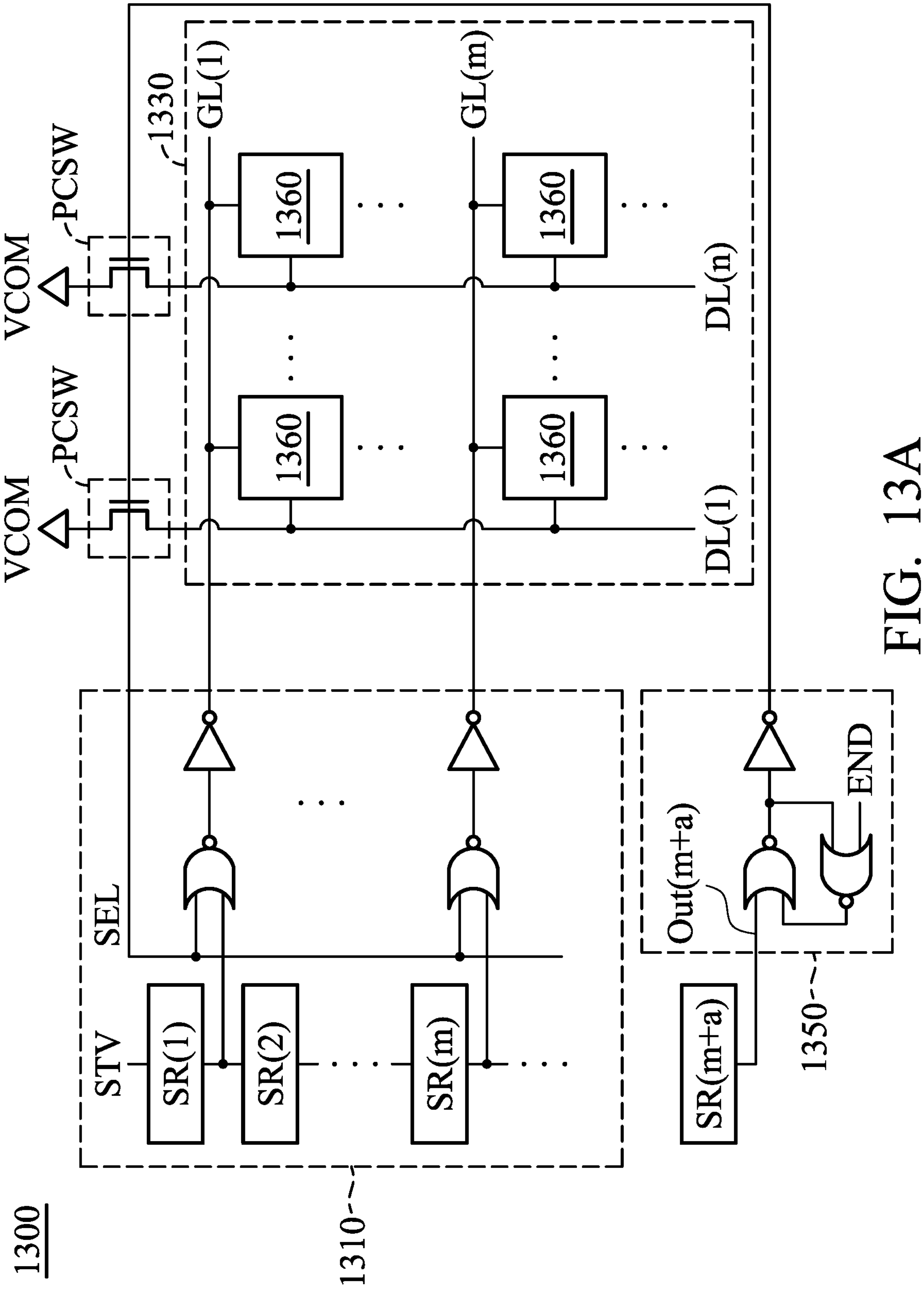
FIG. 13A is an exemplary circuit diagram of a portion of the display device according to a tenth embodiment of the disclosure.

FIG. 13A is an exemplary circuit diagram of a portion of the display device according to a tenth embodiment of the disclosure. Besides the gate driving circuit 1310, the pixel array 1330, the display device 1300 may further comprise a post charge driving circuit 1350 and a plurality of post charge switch circuits PCSW. The pixel array 1330 may comprise a plurality of pixel units 1360. In this embodiment, each pixel unit 1360 does not comprise a voltage level shifting circuit. For example, as the eighth embodiment illustrates above, the display device may comprise a plurality of voltage level shifting circuits coupled between the data driving circuit and the pixel units and plurality of voltage level shifting circuits coupled between the gate driving circuit and the pixel units. Therefore, there is no voltage level shifting circuit comprised in the pixel unit. Or, the display device does not comprise a voltage level shifting circuit.

Figure 13B:
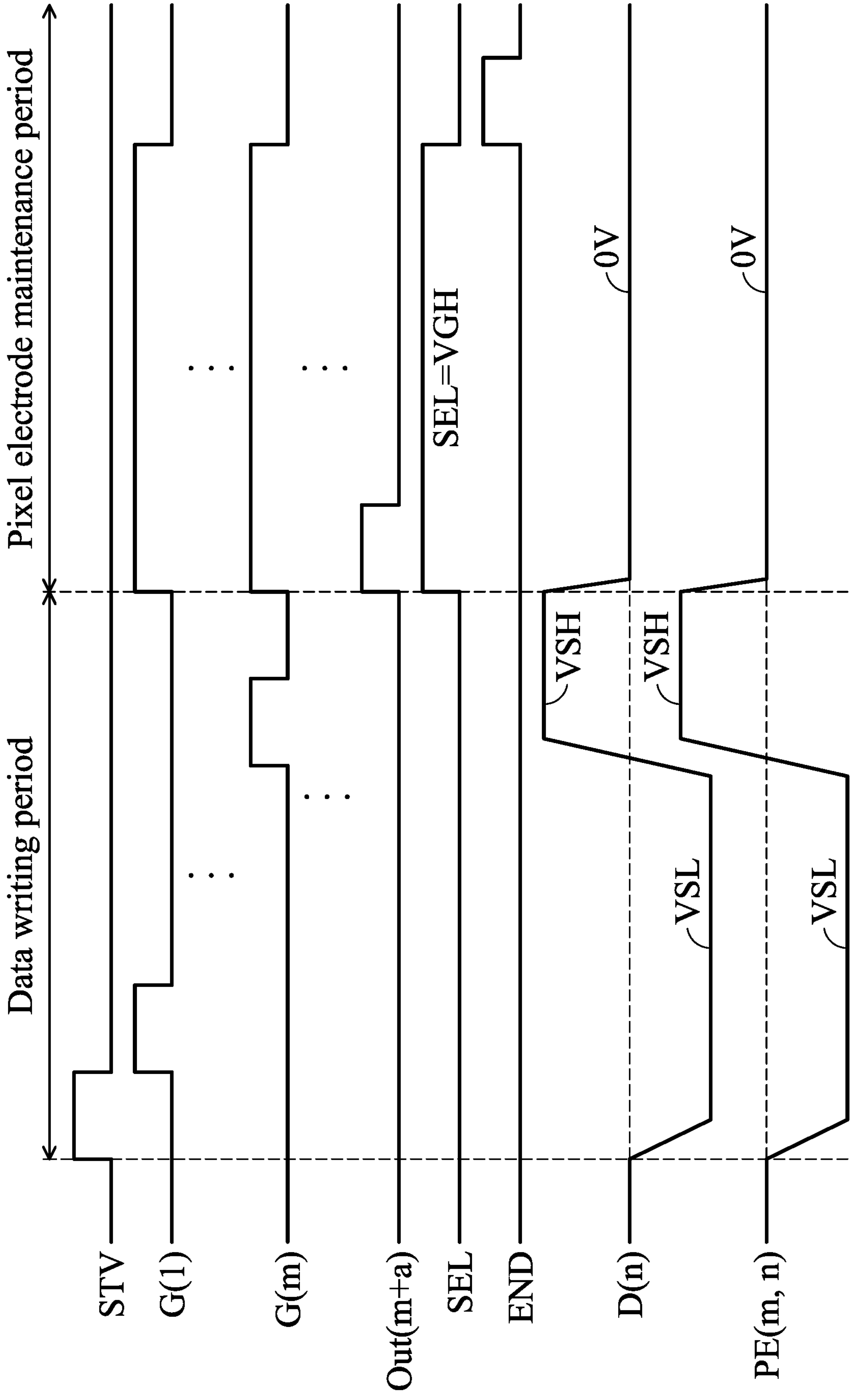
FIG. 13B is another diagram showing the exemplary waveforms of the signals according to the fourth aspect embodiment of the disclosure.

The circuit structure of the display device 1300 is substantially the same as that of the display device 1100, and the difference is only in that there is no voltage level shifting circuit comprised in the pixel unit. Therefore, the level of the predetermined voltage received by the post charge switch circuits PCSW is directly set to the level of the common voltage VCOM. FIG. 13B is another diagram showing the exemplary waveforms of the signals according to the fourth aspect embodiment of the disclosure, that is, the signal waveforms of the display device based on the tenth embodiment of the disclosure. The voltage at the pixel electrode terminal PE is adjusted to have the same level as the common voltage VCOM during the pixel electrode maintenance period since the level of the predetermined voltage is directly set to the level of the common voltage VCOM. Since the differences between the display device 1300 and the display device 1100 are only in the design of the voltage level shifting circuit and the setting of the predetermined voltage, the operations and signal waveforms of the display device 1300 during the data writing period and the pixel electrode maintenance period are substantially the same as that of the display device 1100. Therefore, reference may be made to the descriptions of the display device 1100, and are omitted here for brevity.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the disclosure has been described by way of example and in terms of several embodiments, it is to be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A display device, comprising:

a pixel array, comprising a plurality of pixel units;

a plurality of data lines, coupled to the pixel array; and a plurality of gate lines, coupled to the pixel array, wherein one of the pixel units comprises:

a switch circuit, coupled to one of the plurality of data lines and one of the plurality of gate lines;

a display unit; and a first voltage level shifting circuit, coupled between the switch circuit and the display unit, and the first voltage level shifting circuit being configured to adjust a voltage level of a data driving signal provided by the one of the plurality of data lines to the display unit.

2. The display device as claimed in claim 1, wherein the voltage level of the data driving signal comprises a first voltage level and a second voltage level, the first voltage level is higher than the second voltage level, the first voltage level shifting circuit pulls the voltage level of the data driving signal up from the first voltage level to a target high voltage level, or pulls the voltage level of the data driving signal down from the second voltage level to a target low voltage level.

3. The display device as claimed in claim 2, wherein an absolute value of the target high voltage level or the target low voltage level is greater than 10 volts and less than 20 volts.

4. The display device as claimed in claim 1, further comprising:

a data driving circuit, coupled to the plurality of data lines; and a second voltage level shifting circuit, coupled between the data driving circuit and the pixel unit, and the second voltage level shifting circuit being configured to adjust a voltage level of the data driving signal.

5. The display device as claimed in claim 1, further comprising:

a post charge driving circuit, coupled to the pixel array and configured to output a selection signal; and a plurality of post charge switch circuits, wherein each post charge switch circuit is coupled to one of the plurality of data lines, and wherein the post charge switch circuits receive the selection signal and change the on-off status thereof in response to the selection signal.

6. The display device as claimed in claim 5, further comprising:

a gate driving circuit, coupled to the plurality of gate lines, wherein during a pixel electrode maintenance period, the gate driving circuit is configured to receive the selection signal and generate a plurality of control pulses on the plurality of gate lines in response to the selection signal.

7. The display device as claimed in claim 6, wherein one of the post charge switch circuits comprises:

a first terminal, configured to receive a predetermined voltage;

a second terminal, coupled to the one of the plurality of data lines; and a control terminal, configured to receive the selection signal, wherein during the pixel electrode maintenance period, the post charge switch circuit is turned on in response to the selection signal, and provides the predetermined voltage to the one of the plurality of data lines as the data driving signal.

8. The display device as claimed in claim 7, wherein the first voltage level shifting circuit is configured to receive a target voltage and adjust the voltage level of the data driving signal provided to the display unit according to the target voltage, and the display unit is configured to receive a common voltage, and wherein during the pixel electrode maintenance period, the target voltage is set to the same voltage level as the common voltage.

9. The display device as claimed in claim 6, wherein during a data writing period, the gate driving circuit is configured to sequentially generate a corresponding gate pulse on each of the plurality of gate lines, and wherein the plurality of data lines are configured to provide the data driving signal to the display unit in the pixel array, and after the data writing period has ended, the pixel electrode maintenance period is entered.

10. A display device, comprising:

a pixel array, comprising a plurality of pixel units;

a plurality of data lines, coupled to the pixel array; and a plurality of gate lines, coupled to the pixel array, wherein one of the pixel units comprises:

a switch circuit, coupled to one of the plurality of data lines and one of the plurality of gate lines;

a display unit; and a first voltage level shifting circuit, coupled between the switch circuit and the display unit, and the first voltage level shifting circuit being configured to adjust a voltage level of a data driving signal provided by the one of the plurality of data lines to the display unit, wherein an absolute value of a level of a driving voltage required by the display unit is higher than a predetermined voltage level.

11. The display device as claimed in claim 10, wherein the voltage level of the data driving signal comprises a first voltage level and a second voltage level, the first voltage level is higher than the second voltage level, the first voltage level shifting circuit pulls the voltage level of the data driving signal up from the first voltage level to a target high voltage level, or pulls the voltage level of the data driving signal down from the second voltage level to a target low voltage level.

12. The display device as claimed in claim 11, wherein an absolute value of the target high voltage level or the target low voltage level is greater than 10 volts and less than 20 volts.

13. The display device as claimed in claim 10, further comprising:

a data driving circuit, coupled to the plurality of data lines; and a second voltage level shifting circuit, coupled between the data driving circuit and the pixel unit, and the second voltage level shifting circuit being configured to adjust a voltage level of the data driving signal.

14. The display device as claimed in claim 10, further comprising:

a post charge driving circuit, coupled to the pixel array and configured to output a selection signal; and a plurality of post charge switch circuits, wherein each post charge switch circuit is coupled to one of the plurality of data lines, and wherein the post charge switch circuits receive the selection signal and change the on-off status thereof in response to the selection signal.

15. The display device as claimed in claim 14, further comprising:

a gate driving circuit, coupled to the plurality of gate lines, wherein during a pixel electrode maintenance period, the gate driving circuit is configured to receive the selection signal and generate a plurality of control pulses on the plurality of gate lines in response to the selection signal.

16. The display device as claimed in claim 15, wherein one of the post charge switch circuits comprises:

a first terminal, configured to receive a predetermined voltage;

a second terminal, coupled to the one of the plurality of data lines; and a control terminal, configured to receive the selection signal, wherein during the pixel electrode maintenance period, the post charge switch circuit is turned on in response to the selection signal, and provides the predetermined voltage to the one of the plurality of the data lines as the data driving signal.

17. The display device as claimed in claim 16, wherein the first voltage level shifting circuit is configured to receive a target voltage and adjust the voltage level of the data driving signal provided to the display unit according to the target voltage, and the display unit is configured to receive a common voltage, and wherein during the pixel electrode maintenance period, the target voltage is set to the same voltage level as the common voltage.

18. The display device as claimed in claim 15, wherein during a data writing period, the gate driving circuit is configured to sequentially generate a corresponding gate pulse on each of the plurality of gate lines, and wherein the plurality of data lines are configured to provide the data driving signal to the display unit in the pixel array, and after the data writing period has ended, the pixel electrode maintenance period is entered.

* * * * *